United States Patent
Hillman et al.

(10) Patent No.: US 11,696,413 B2
(45) Date of Patent: Jul. 4, 2023

(54) SUPPORT STRUCTURE FOR ELECTRONIC BANNER DISPLAY

(71) Applicant: Daktronics, Inc., Brookings, SD (US)

(72) Inventors: Matthew G. Hillman, Brookings, SD (US); Lincoln Hahn, Brookings, SD (US)

(73) Assignee: Daktronics, Inc., Brookings, SD (US)

( * ) Notice: Subject to any disclaimer, the term of this patent is extended or adjusted under 35 U.S.C. 154(b) by 0 days.

(21) Appl. No.: 17/362,042

(22) Filed: Jun. 29, 2021

(65) Prior Publication Data

US 2022/0007522 A1 Jan. 6, 2022

Related U.S. Application Data

(60) Provisional application No. 63/047,067, filed on Jul. 1, 2020.

(51) Int. Cl.
*H05K 5/00* (2006.01)
*G09F 9/302* (2006.01)
*G09F 9/33* (2006.01)

(52) U.S. Cl.
CPC ......... *H05K 5/0021* (2013.01); *G09F 9/3026* (2013.01); *H05K 5/0017* (2013.01); *G09F 9/33* (2013.01)

(58) Field of Classification Search
USPC ................................. 361/730, 807, 809, 810
See application file for complete search history.

(56) References Cited

U.S. PATENT DOCUMENTS

| 10,646,059 | B1 | 5/2020 | Van Der Walde |
| 2009/0146918 | A1 | 6/2009 | Kline et al. |
| 2009/0290076 | A1 | 11/2009 | Tait et al. |

(Continued)

FOREIGN PATENT DOCUMENTS

| AU | 2021204426 A1 | 1/2022 |
| CN | 201688096 | 12/2010 |

(Continued)

OTHER PUBLICATIONS

"United Kingdom Application Serial No. 2109327.3, Combined Search and Examination Report dated Dec. 23, 2021", 8 pgs.

(Continued)

*Primary Examiner* — Hung S. Bui
(74) *Attorney, Agent, or Firm* — Schwegman Lundberg & Woessner, P.A.

(57) ABSTRACT

A display comprises a display surface formed from a plurality of display modules arranged in proximity, each display module comprising a plurality of light-emitting elements configured to collectively display one or more of video, graphical, or textual information, and a support array onto which the plurality of display modules is mounted to form the display surface. The support array comprises a plurality of tension members, a plurality of support members arranged in an array, each of the plurality of support members comprising a mounting face and each being supported by at least one of the plurality of tension members. Each of the tension members is suspended either from a support structure or another one of the support members, and each of the display modules is coupled to the mounting face of one or more of the support members.

13 Claims, 14 Drawing Sheets

(56) References Cited

U.S. PATENT DOCUMENTS

2019/0373745 A1* 12/2019 Miller .................. H05K 5/0017
2022/0108638 A1* 4/2022 Schuettke ............. G09F 9/3026

FOREIGN PATENT DOCUMENTS

| CN | 202307008 U | 7/2012 |
| CN | 105805516 | 7/2016 |
| KR | 20070108964 A | 11/2007 |
| WO | WO-2019083358 A1 | 5/2019 |

OTHER PUBLICATIONS

"United Kingdom Application Serial No. 2109327.3, Preliminary Examination Report under Section 15A dated Jul. 13, 2021", 2 pgs.
"United Kingdom Application Serial No. 2109327.3, Subsequent Examination Report under Section 18 (3) dated Feb. 21, 2023", 5 pgs.
"United Kingdom Application Serial No. 2109327.3, Response filed Apr. 18, 2023 to Subsequent Examination Repod under Section 18 (3) dated Feb. 21, 2023", 17 pgs.

* cited by examiner

SUPPORT STRUCTURE FOR ELECTRONIC BANNER DISPLAY

CROSS-REFERENCE TO RELATED APPLICATION

This application claims the benefit of priority to U.S. Provisional Patent Application Ser. No. 63/047,067 entitled "SUPPORT STRUCTURE FOR ELECTRONIC BANNER DISPLAY," filed Jul. 1, 2020, the disclosure of which is incorporated by reference herein in its entirety.

BACKGROUND

Displays comprising a plurality of light-emitting elements, or display modules, are used for the display of information. In some applications, such as digital billboards or scoreboards, individual display modules can be connected together and operated collectively to form a larger display. The larger display can be hung from a support structure, such as the ceiling of a building or a support beam, to provide a display with the appearance of an overhanging banner, often referred to as a banner display.

SUMMARY

The present disclosure describes modular support arrays for hanging banner displays that can cooperatively support a plurality of display modules in order to form an overall display surface. The modular support arrays described herein provide for more flexibility in creating unique geometries for the resulting hanging displays and provide for reduce weight for the overall display compared to earlier support structures.

In an example, the present disclosure describes a display comprising a display surface formed from a plurality of display modules arranged in proximity, each display module comprising a plurality of light-emitting elements configured to collectively display one or more of video, graphical, or textual information, and a support array onto which the plurality of display modules is mounted to form the display surface. The support array comprises a plurality of tension members, and a plurality of support members arranged in an array, each of the plurality of support members comprising a mounting face and each being supported by at least one of the plurality of tension members, wherein each of the plurality of tension members are suspended either from a support structure or another one of the plurality of support members, and wherein each of the plurality of display modules is coupled to the mounting face of one or more of the plurality of support members.

In another example, the present disclosure describes a display comprising a display surface formed from a plurality of display modules arranged in proximity, each display module comprising a plurality of light-emitting elements configured to collectively display one or more of video, graphical, or textual information, and a support array onto which the plurality of display modules is mounted to form the display surface. The support array comprises a plurality of tension members, a plurality of support members arranged in an array, wherein each support member is constructed from a plurality of substructures that are combined to form the support member, and wherein each of the plurality of support members comprises a mounting face and each being supported by at least one of the plurality of tension members, wherein each of the plurality of tension members are suspended either from a support structure or another one of the plurality of support members, and wherein each of the plurality of display modules is coupled to the mounting face of one or more of the plurality of support members.

In yet another example, the present disclosure describes a display system comprising a display surface formed from a plurality of display modules arranged in proximity, each display module comprising a plurality of light-emitting elements configured to collectively display one or more of video, graphical, or textual information, an elongated support member, and a support array onto which the plurality of display modules is mounted to form the display surface. The support array comprises a plurality of mounting members arranged in an array, each of the plurality of mounting members each comprising a mounting face portion with one or more first display module mounting features and a tension supporting portion extending upward from the mounting face portion, wherein a first row of the plurality of mounting members are suspended from the elongated support member by their tension supporting portions, wherein a chain of the plurality of mounting members are suspended from each of the mounting members of the first row, wherein the tension supporting portion of each mounting member of the chain is coupled to the mounting face portion of another one of the plurality of mounting members, and a plurality of top mounting members each corresponding to one of the mounting members of the first row, each top mounting member comprising a main mounting portion with one or more second display module mounting features and at least one alignment portion extending downward from the main mounting portion, wherein the at least one alignment portion engages the corresponding mounting member of the first row, and wherein each of the plurality of display modules comprises one or more mounting member coupling structures configured for couple to a corresponding one of the first display module mounting features or a corresponding one of the second display module mounting features.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
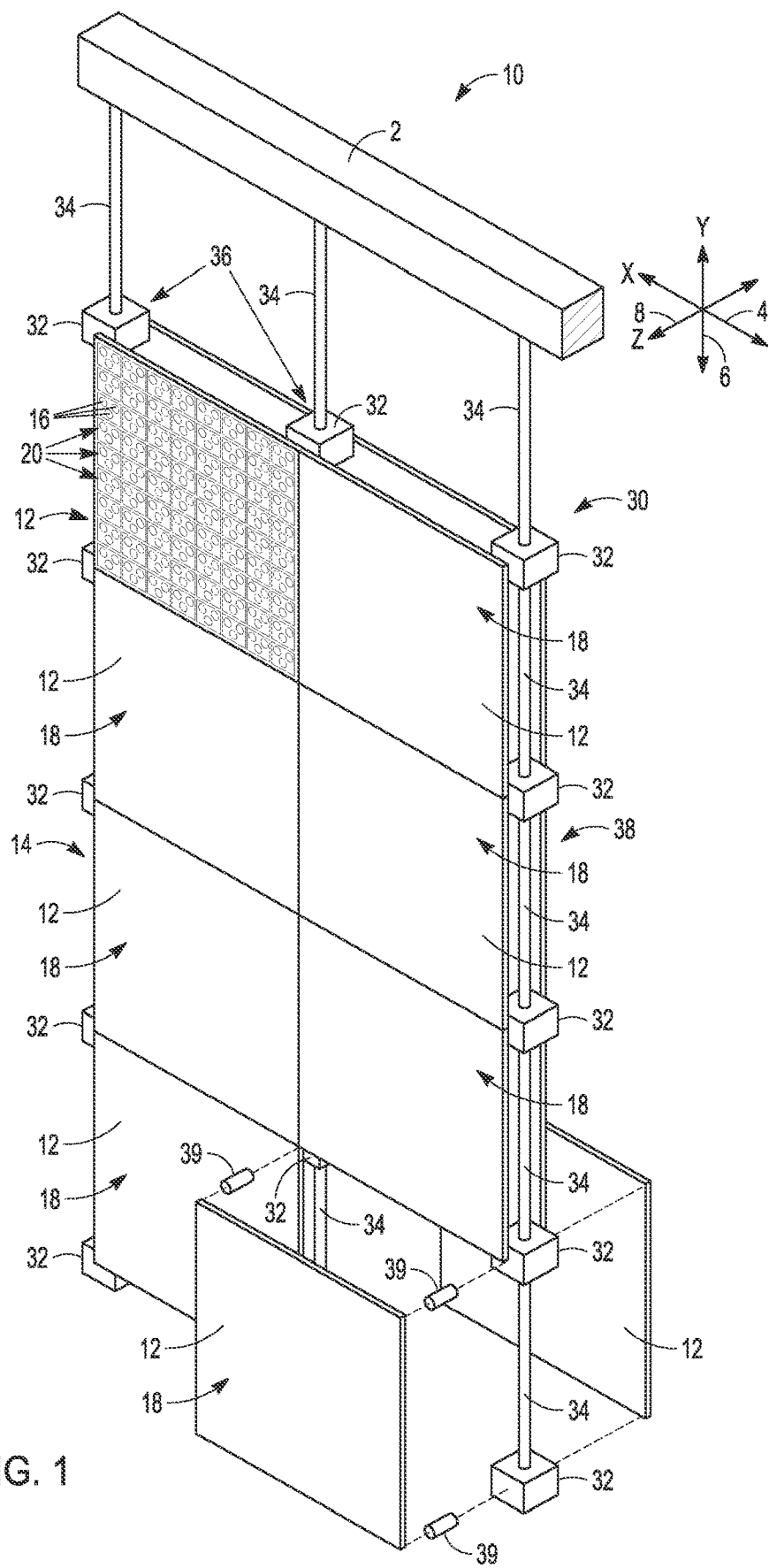
FIG. 1 is perspective view of an example banner display.

In the following Detailed Description, reference is made to the accompanying drawings which form a part hereof. The drawings show, by way of illustration, examples of banner displays and systems for supporting a banner display from a support structure, such as the ceiling of a building or an elongated support member, such as a support beam. The examples are described in sufficient detail to enable those skilled in the art to practice, and it is to be understood that other embodiments can be utilized and that changes can be made without departing from the scope of the present disclosure. Therefore, the following Detailed Description is not to be taken in a limiting sense, and the scope of the present disclosure is defined by the appended claims and their equivalents.

References in the specification to "one embodiment", "an embodiment," "an example embodiment," etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a concentration range of "about 0.1% to about 5%" should be interpreted to include not only the explicitly recited concentration of about 0.1 wt. % to about 5 wt. %, but also the individual concentrations (e.g., 1%, 2%, 3%, and 4%) and the sub-ranges (e.g., 0.1% to 0.5%, 1.1% to 2.2%, and 3.3% to 4.4%) within the indicated range. The statement "about X to Y" has the same meaning as "about X to about Y,"" unless indicated otherwise. Likewise, the statement "about X, Y, or about Z" has the same meaning as "about X, about Y, or about Z," unless indicated otherwise.

In this document, the terms "a," "an," or "the" are used to include one or more than one unless the context clearly dictates otherwise. The term "or" is used to refer to a nonexclusive "or" unless otherwise indicated. Unless indicated otherwise, the statement "at least one of" when referring to a listed group is used to mean one or any combination of two or more of the members of the group. For example, the statement "at least one of A, B, and C" can have the same meaning as "A; B; C; A and B; A and C; B and C; or A, B, and C," or the statement "at least one of D, E, F, and G" can have the same meaning as "D; E; F; G; D and E; D and F; D and G; E and F; E and G: F and G; D, E, and F; D, E, and G; D, F, and G; E, F, and G; or D, E, F, and G." A comma can be used as a delimiter or digit group separator to the left or right of a decimal mark; for example, "0.000,1"" is equivalent to "0.0001."

In addition, it is to be understood that the phraseology or terminology employed herein, and not otherwise defined, is for the purpose of description only and not of limitation. Any use of section headings is intended to aid reading of the document and is not to be interpreted as limiting, and information that is relevant to a section heading may occur within or outside of that particular section. All publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

In the methods described herein, the acts can be carried out in any order without departing from the principles of the disclosed method, except when a temporal or operational sequence is explicitly recited. Furthermore, specified acts can be carried out concurrently unless explicit language recites that they be carried out separately. For example, a recited act of doing X and a recited act of doing Y can be conducted simultaneously within a single operation, and the resulting process will fall within the literal scope of the process. Recitation in a claim to the effect that first a step is performed, then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first and steps B, C, D, and E can be carried out in any sequence between steps A and E, and that the sequence still falls within the literal scope of the claimed process. A given step or sub-set of steps may also be repeated.

The term "about" as used herein can allow for a degree of variability in a value or range, for example, within 10%, within 5%, within 1%, within 0.5%, within 0.1%, within 0.05%, within 0.01%, within 0.005%, or within 0.001% of a stated value or of a stated limit of a range and includes the exact stated value or range.

The term "substantially" as used herein refers to a majority of, or mostly, such as at least about 50%, 60%, 70%, 80%, 90%, 95%, 96%, 97%, 98%, 99%, 99.5%, 99.9%, 99.99%, or at least about 99.999% or more, or 100%.

Banner Display

FIG. 1 shows an example banner display 10. The banner display 10 is configured to be supported in a hanging manner from a support structure 2. In an example, the support structure 2 is a portion of a wall or ceiling of a building or any other substantially solid and strong structure that will be able to hold the weight of the display 10. In an example, the support structure 2 is an elongated support structure, such as a support beam, for example an I-beam or other elongated structural member. For the sake of clarity, the support member 2 will be referred to as the "elongated support structure 2" or the "support beam 2." However, those of skill in the art will appreciate that other types of support structures can be used.

To assist in the description, the banner displays described herein will be arbitrarily defined using rectilinear Cartesian coordinates, e.g., with orthogonal axes in each dimensional direction, i.e., an x-direction that extends along an x-axis 4, a y-direction that extends along a y-axis 6, and a z-direction that extends along a z-axis 8. In the example of FIG. 1, the x- and y-directions are defined as the directions in which the planar or substantially planar display surface 14 extends, wherein the x-direction corresponds to the horizontal or lateral width of the display surface 14 and the y-direction corresponds to the vertical height of the display surface 14. In the example of FIG. 1, the z-direction is defined as the direction into and out of the display surface 14 (e.g., corresponding to the thickness of the banner display 10). Those of skill in the art will appreciate that the x-axis 4, y-axis 6, and z-axis 8 are merely a hypothetical construct and that many other methods of defining the directions and space of the banner display 10 can be used. Similar definitions for the x-direction, y-direction, and z-direction and the corresponding x-axis 4, y-axis 6, and z-axis 8 are used for the other banner displays shown and described herein.

The banner display 10 includes a plurality of display modules 12 that are mounted in close proximity to one another such that the display modules 12 collective form a display surface 14 that extends in the x-direction and the y-direction. The display modules 12 are configured to display one or more of video, graphical, or textual information. For this reason, the display modules 12 may also be referred to herein as "video display modules" or "graphical display modules" and the banner display 10 may be referred to as a "video display" or a "graphical display." In an example, each display module 12 includes a plurality of light-emitting elements 16 coupled to a front face 18 of the display module 12. When a display module 12 is installed in the banner display 10, the front face 18 extends in the x-direction and the y-direction, just as the display surface 14, such that the front faces 18 of the plurality of display modules 12 form the overall display surface 14 of the display 10. The light-emitting elements 16 are positioned on the front faces 18 of the display modules 12 and the light-emitting elements 16 are operated in such a way so that the display modules 12 display the video, graphical, or textual information to someone who is viewing the banner display 10.

The light-emitting elements 16 can be any type of light-emitting technology known or yet to be discovered for the display of visual information, such as video, graphical, or textual information. At the time of filing of the present application, light-emitting diodes (LEDs) are one of the most common light-emitting technologies in use for video or graphical displays of the type described herein. As such, for the sake of brevity, the light-emitting elements 16 will be referred to as LEDs 16 throughout the present disclosure. However, it will be understood that any time the following description uses the term "light-emitting diode" or "LED," that light-emitting devices other than LEDs can be used, including, but not limited to, liquid crystal display devices (LCDs), organic light-emitting diodes (OLEDs), organic light-emitting transistors (OLETs), surface-conduction electron-emitter display devices (SEDs), field-emission display devices (FEDs), laser TV quantum dot liquid crystal display devices (QD-LCDs), quantum dot light-emitting diode display devices (QD-LEDs), ferro-liquid display devices (FLDs), and thick-film dielectric electroluminescent devices (TDELs).

In an example, the LEDs 16 are arranged into an array of pixels 20, e.g., with each pixel 20 including one or more LEDs 16 grouped together in close proximity. The LEDs 16 and the pixels 20 are only shown on one display module 12 in FIGS. 1 and 2 and are omitted from the remaining display modules 12 so that other features of the banner display 10 are easier to discern. The sizes of the pixels 20 and the LEDs 16 relative to the overall size of the banner display 10 are not necessarily shown on the scale A person of ordinary skill in the art will understand that all of the display modules 12 that make up the banner display 10 can include pixels 20 of LEDs 16 or that each LED 16 and/or pixel 20 can have a different size relative to the banner display 10.

In an example, multiple LEDs 16 are positioned together at each pixel 20. In some examples, the plurality of LEDs 16 includes a plurality of different-colored LEDs 16 such that different-colored LEDs 16 of each pixel 20 can cooperate to display what appears to be a spectrum of different colors for the viewer of the banner display 10. In an example, each pixel 20 includes a red LED 16, a green LED 16, and a blue LED 16, wherein the red, green, and blue LEDs of each pixel 20 cooperate to provide essentially the entire color spectrum that is visible to humans based on whether one, two, or all three of the LEDs 16 in a pixel 20 are lit and at what intensities. The front face 18 can also provide a black or empty looking surface over a portion of the display, when desired, by deactivating or turning off the LEDs in a particular pixel 20.

In an example, adjacent display modules 12 are in close proximity to one other and the plurality of display modules 12 are operated together in such a way as to display the video, graphical, or textual information in a cohesive manner on the display surface 14 (which is formed from the combination of the front faces 18 of the display modules 12) so that the entire banner display 10 appears to a viewer as a single display that is larger than the individual display modules 12.

In an example, the pixels 20 are arranged in a grid-like array, such as a grid comprising a specified number of rows and a specified number of columns of the pixels 20. In an example, the rows of pixels 20 can extend in the x-direction while the columns of pixels 20 can extend in the y-direction. The banner display 10 can be controlled, for example with control software and/or one or more hardware controllers, so that visual information, e.g., video, graphical, or textual information, is broken down into coordinates. Each coordinate can correspond to a specific pixel location within the overall banner display 10 (i.e., a specified row and specified column of the grid-like array) and the control software and/or the one or more hardware controllers can operate each pixel according to a program that specifies a condition for each coordinate within the image and controls each of the pixels 20 so that it will appear to emit light that meets the condition specified. For example, if the banner display 10 is displaying a video or animation, the control software and/or the one or more hardware controllers can be fed data corresponding to the video or animation, and the control software and/or the one or more hardware controllers can break the video or animation data down into conditions for each pixel 20, such as the time within the video or animation, the color that a pixel 20 is to display at that time and the intensity of the pixel 20 at that time. The control software and/or the one or more hardware controllers can also convert the information regarding color and intensity into specific operating parameters for each LED 16 in a particular pixel 20, such as the power that will be supplied to the red LED 16, the blue LED 16, and the green LED 16 in that pixel 20 and for how long that power is to be applied in order to achieve the specified color and intensity at the specified time. The control software and/or the one or more hardware controllers can then send control signals to the pixels 20 or to individual LEDs 16 that can operate the pixels 20 according to the video or animation. Although a grid or grid-like array of LED pixels, as summarized above, is common for video banner displays, the banner display 10 described herein can use other arrangements of the LEDs 16 or other systems for addressing the LEDs 16 can be used without varying from the scope of the present disclosure.

The plurality of display modules 12 are mounted to and supported by a support array 30 comprising of a plurality of separate structures 32 onto which the display modules 12 are mounted, which are also referred to herein as "mounting blocks 32." As described in more detail below, each mounting block 32 is supported by a tension member 34 that is coupled either to the support beam 2 or to another one of the mounting blocks 32. The mounting blocks 32 and the tension members 34 are positioned and arranged so that the mounting blocks 32 and the tension members 34 work together to collectively form a larger support structure in the form of the support array 30, which supports the plurality of display modules 12 in order to form a display surface 14 of the banner display 10.

In an example, a successive string of mounting blocks 32 and tension members 34 can form a hanging column or spine 36 that is hung from the support beam 2 (each referred to hereinafter as the "hanging spine 36" or simply "spine 36," for brevity). A plurality of these separately hanging spines 36 can be hung in a side-by-side arrangement so that the hanging spines 36 collectively form the overall support array 30. In this way, the hanging mounting blocks 32 and tension members 34 can take the place of more conventional support structures that comprise an essentially unitary support structure that is solid or substantially solid throughout. As is described in more detail below, the separated hanging spines 36 of the mounting blocks 32 and the tension members 34 can allow the total weight of the banner display 10 to be substantially lower than it would be for a comparable banner display that uses the conventional unitary and solid support structure.

In an example, the banner display 10 is connected to the support beam 2 and is hung from the support beam 2 by one or more tension members 34 that are coupled to the support beam 2 and to the banner display 10 in order to support the mounting blocks 32 from the support beam 2. In an example, each tension member 34 is a mechanical structure with a length in a vertical direction (e.g., in the y-direction, or up and down in FIGS. 1 and 2) that is substantially longer than its width in a horizontal or lateral direction (e.g., the x-direction, or left to right in FIGS. 1 and 2), and that is capable of withstanding a substantial tensile force exerted by gravitational force exerted by the display modules 12 and the support array 30. Examples of tension members 34 that might be commonly used to support the banner display 10 to the support beam 2 include, but are not limited to, cables (such as steel cables), rods (such as metal rebar rods), chains, ropes, beams, or thin metal bars. In some examples, the material that the tension members 34 are made from and the physical shape that the tension members 34 take is not important so long as the tension members 34 can collectively support the banner display 10 and so long as each tension member 34 can be connected to the support beam 2 and/or one or more corresponding mounting blocks 32. In an example, the tension members 34 comprise cables, such as metal cables, for example steel cables. For this reason, the tension members 34 may also be referred to as cables 34. However, a person of ordinary skill in the art will understand that other forms of tension members 34 can be used without varying from the scope of the present invention.

In an example, the banner display 10 is configured so that visual information can be displayed from more than one side of the banner display 10. The example banner display 10 shown in FIG. 1 includes a front display surface 14 on a first, or front, side of the banner display 10 and a rear display surface 38 on a second, or rear, side of the banner display 10. In the example shown in FIGS. 1 and 2, the front display surface 14 and the rear display surface 38 are substantially identical, with the only difference being that the front display surface 14 and the rear display surface 38 are generally facing in opposing directions. Both display surfaces 14, 38 include a plurality of display modules 12 arranged in a close arrangement, as described above, so that LEDs 16 on the front display surface 14 and the rear display surface 38 (such as the LEDs 16 shown in FIG. 1) can be operated together to display visual information on the display surfaces 14, 38.

Because the banner display 10 is being hung from the support beam 2 by the one or more cables 34, it is advantageous for the overall weight of the banner display 10 to be reduced as much as is possible so that the banner display 10 does not exceed the weight limit that the support beam 2 or the cables 34 are capable of carrying. For example, in some applications, the banner display 10 is configured to hang from a ceiling of a public place, such as a shopping mall or train station, such that people will be walking under the banner display 10 regularly. For this reason, it is desirable for the manufacturer of the banner display 10 to make each of the components of the banner display 10 to be as light as possible so that the overall weight of the banner display 10 is lower than a typical weight specification for a ceiling structure, and preferably much lower than the weight specification.

As noted above, in an example, the display modules 12 of the front display surface 14 and the rear display surface 38 are mounted onto the support array 30. The support array 30 of the present disclosure is particularly designed and adapted to allow for a reduced and more optimized weight for the banner display 10 while still providing sufficient structural integrity to support the display modules 12.

In the example shown in FIG. 1, the display modules 12 can be coupled to the mounting blocks 32 of the support array 30 with one or more fasteners 39. In an example, the fasteners 39 can be pins, threaded rods or bolts, staples, nails, brads, or any other fastener capable of coupling a display module 12 to the mounting structure 20 (either permanently, semi-permanently, or temporarily). In other examples, described in more detail below, a "fastener," as that term is conventionally understood, may not be used at all. For example, each display module 12 can be coupled to its corresponding mounting blocks 32 by a close fit between a structure on the display module 12 and a corresponding structure on the mounting block 32, welding, adhering with an adhesive, clamping, magnetic attraction, or otherwise coupling the display modules 12 to the mounting blocks 32.

In an example, the mounting blocks 32 and the tension members 34 are made from relatively light-weight materials. While the mounting blocks 32 and the tension members 34 are made from a relatively light-weight material, in some examples, they still provide one or more of: sufficient mechanical strength (i.e., tension strength, compression strength, or both) to support the display modules 12; sufficient durability to last during the specified life span of the banner display 10; and sufficient rigidity so that neither the mounting blocks 32 nor the tension members 34 deform during use of the banner display 10. As described in more detail below, one relatively light-weight material that may be advantageously used to form the mounting blocks 32, the tension members 34, or both, is sheet metal, such as sheet steel, that has been shaped so that it can form the mounting block 32 or the tension member 34, or both.

One or more of the display modules 12 are coupled to each of the mounting blocks 32. Each mounting block 32 is configured so that it will be in a specified position relative to the display module 12 or display modules 12 to which it is coupled. FIGS. 2A-2D show a rear plan view of various examples of banner displays 100A, 100B, 100C, and 100D (e.g., a view of the back side of the banner displays). The banner displays 100A, 100B, 100C, 100D each include a different configuration of a support array 40, 50, 60, 70 for supporting the display modules 12 of its corresponding banner display 100A, 100B, 100C, 100D. Any one of the support arrays 40, 50, 60, 70 of FIGS. 2A-2D could be substituted for the support array 30 of FIG. 1.

Figure 2A:
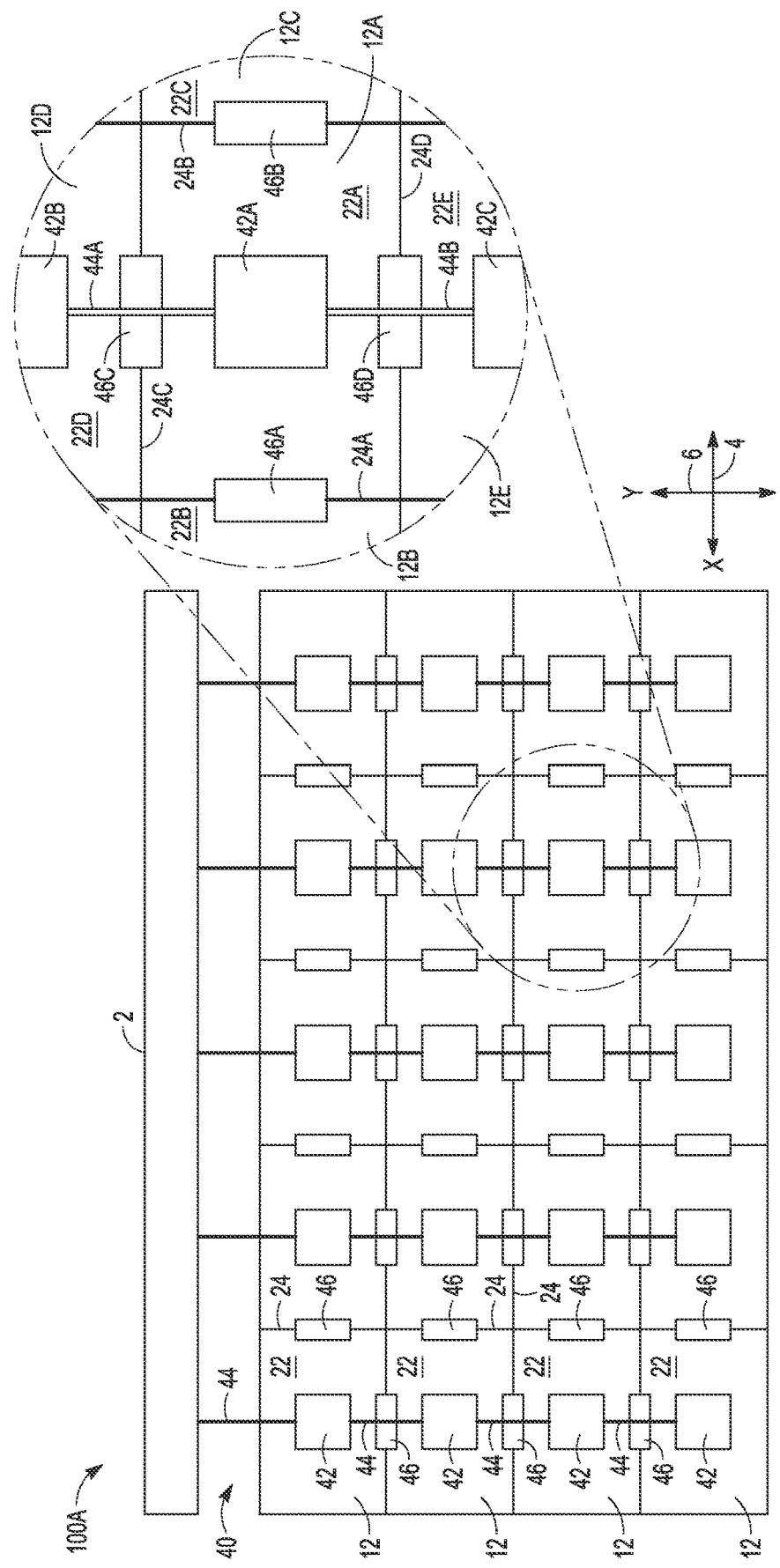
FIGS. 2A-2D are rear plan views of various alternative embodiments of support arrays for supporting display modules of a banner display.

FIG. 2A shows an example banner display 100A comprising a plurality of display modules 12 that are supported by a support beam 2, similar to the banner display 10 in FIG. 1. Also similar to the banner display 10 in FIG. 1, the display modules 12 in the banner display 100A of FIG. 2A are supported by a support array 40 that is formed from a plurality of mounting blocks 42 connected to one or more tension members 44 which are suspended from the support beam 2. Each display module 12 is coupled to a mounting face of a corresponding one of the mounting blocks 42, e.g., with the mounting face of the mounting block 42 coupled to a rear face 22 of the display module 12, so that the support array 40 supports the weight of the plurality of display modules 12. In the example support array 40 of FIG. 2A, each mounting block 42 is coupled to only one corresponding display module 12, e.g., with the mounting face of the mounting block 42 being coupled at or proximate to a geometric center of the rear face 22 of the display module 12.

For example, as shown in the inset of FIG. 2A, a first display module 12A is located somewhere in the middle of the banner display 100A. The example display modules 12 of the banner display 100A are rectangular in shape with four linear edges 24 such that the first display module 12A has a first edge 24A and a second edge 24B on the lateral sides of the display module 12A (e.g., in the x-direction along the x-axis 4, or the left edge 24A and the right edge 24B as shown in FIG. 2A) and a third edge 24C and a fourth edge 24B on the vertical sides of the display module 12A (e.g., in the y-direction along the y-axis 6, or the top edge 24C and the bottom edge 24D as shown in FIG. 2A).

In the example of FIG. 2A, the display modules 12 are aligned in a grid-like array so that the first display module 12A is adjacent to four display modules 12, one adjacent to each of the edges 24A, 24B, 24C, and 24D, i.e., a second display module 12B at the first edge 24A, a third display module 12C at the second edge 24B, a fourth display module 12D at the third edge 24C, and a fifth display module 12E at the fourth edge 24D (there are also display modules 12 adjacent to each corner of the first display module 12A, however these display modules 12 are not specifically identified in FIG. 2A or its inset).

As can be further seen in the FIG. 2A inset, the mounting block 42A that is coupled to and supports the first display module 12A is coupled to and supported by a first tension member 44A, which in turn is coupled to and is hanging from a mounting block 42B that is coupled to and supports the fourth display module 12D. A second tension member 44B is coupled to and hung from the first mounting block 42A so that the second tension member 44B can be coupled to and support a mounting block 42C that is coupled to and supports the fifth display module 12E.

Because each mounting block 42 is only coupled to one corresponding display module 12, there could be the possibility of adjacent display modules 12 shifting with respect to one another. Therefore, in an example the support array 40 comprises one or more connectors 46 that are coupled to a particular display module 12 and an adjacent display module 12. In an example, the support array 40 includes a connector 46 at each edge 24 of the display module 12 that touches an edge 24 of an adjacent display module 12. For example, as is best seen in the FIG. 2A inset, a first connector 46A can be coupled to the first display module 12A and to the second display module 12B at the first edge 24A, a second connector 46B can be coupled to the first display module 12A and to the third display module 12C at the second edge 24B, a third connector 46C can be coupled to the first display module 12A and to the fourth display module 12D at the third edge 24C, and a fourth connector 46D can be coupled to the first display module 12A and to the fifth display module 12E at the fourth edge 24D. Similar coupling between other adjacent display modules 12 can be provided with other connectors 46 throughout the support array 40.

Figure 2B:
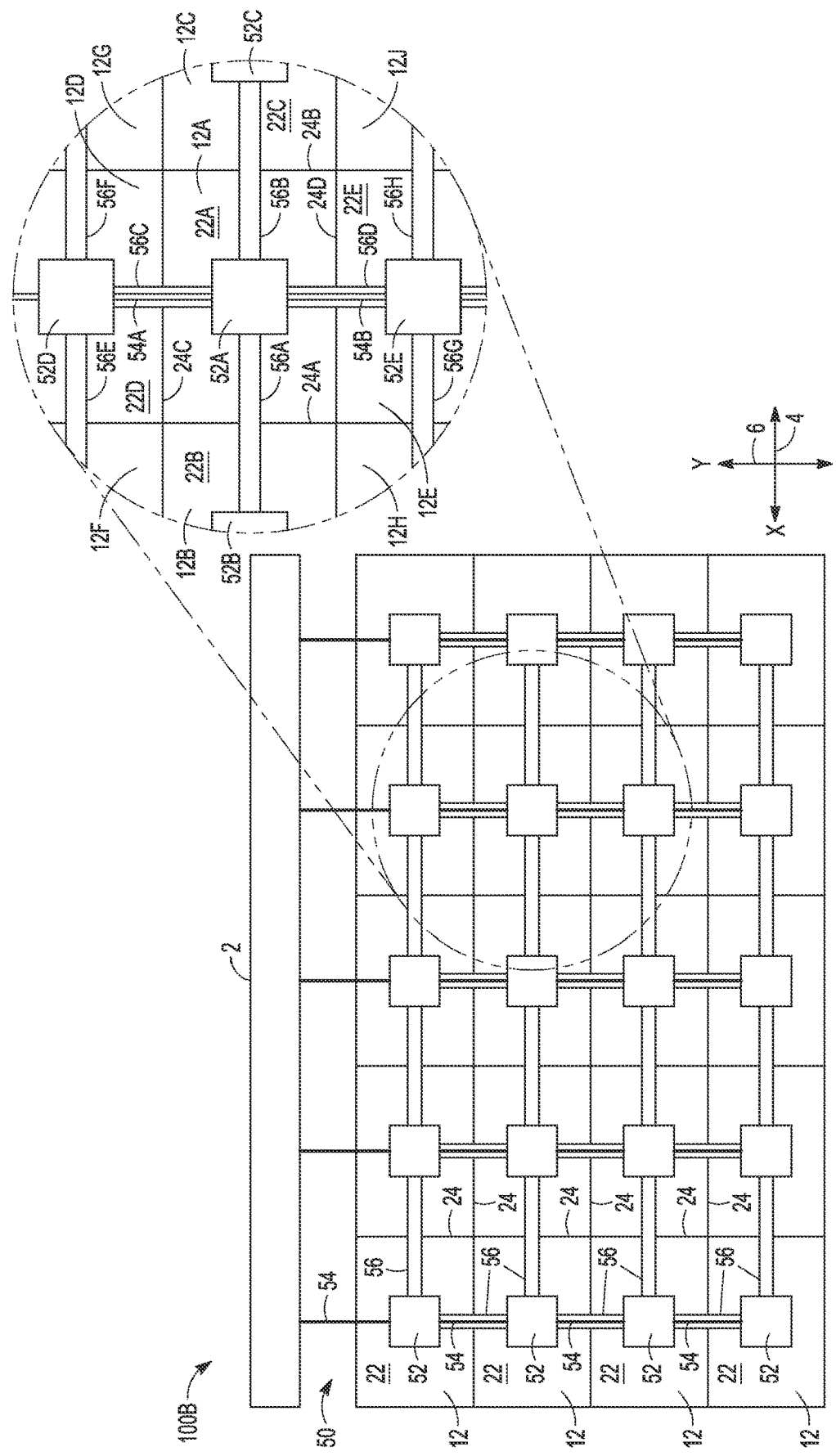

FIG. 2B shows a rear plan view of another example banner display 100B with another example of a support array 50 to support a plurality of display modules 12. Like the support arrays 30 and 40, the support array 50 includes a plurality of mounting blocks 52 connected to one or more tension members 54 which are suspended from a support beam 2. Each display module 12 is coupled to a mounting face of a corresponding one of the mounting blocks 52, e.g., with the mounting face of the mounting block 52 being coupled to the rear face 22 of the display module 12, so that the support array 50 supports the weight of the plurality of display modules 12. In an example, each mounting block 52 of the support array 50 of FIG. 2B is coupled to only one corresponding display module 12, e.g., with the mounting face of the mounting block 52 being coupled at or proximate to a geometric center of the rear face 22 of the display module 12, similar or identical to the mounting block 42 of the support array 40.

For example, as shown in the inset of FIG. 2B, a first display module 12A is located somewhere in the middle of the banner display 100B, with second and third display modules 12B and 12C adjacent to the lateral edges 24A and 24B of the first display module 12A (e.g., the edges 24A, 24B can extend in the y-direction and can be located on the sides of the display module 12A located in the x-direction along the x-axis 4 from the center of the display module 12A) and fourth and fifth display modules 12D and 12E adjacent to the top and bottom edges 24C and 24D of the first display module 12A (e.g., the edges 24C, 24D can extend in the x-direction and can be located on the sides of the display module 12A that are on the sides located in the y-direction along the y-axis 6 from the center of the display module 12A).

Similar to the support array 40 of FIG. 2A, a mounting block 52A that is coupled to and supports the first display module 12A of the support array 50 is coupled to and supported by a first tension member 54A, which in turn is coupled to and is hanging from a mounting block 52D that is coupled to and supports the fourth display module 12D located above the first display module 12A. A second tension member 54B is coupled to and hangs from the first mounting block 52A so that the second tension member 54B can be coupled to and support a mounting block 52E that is coupled to and supports the fifth display module 12E located below the first display module 12A.

As with the support array 40 of FIG. 2A, because each mounting block 52 is only coupled to one corresponding display module 12, there could be a possibility of adjacent display modules 12 shifting relative to one another. However, FIG. 2B shows an alternative to the connectors 46 that are coupled to the display modules 12 in the support array 40 of FIG. 2A. Instead, the support array 50 of FIG. 2B includes connectors 56 that are coupled to the mounting blocks 52 that support adjacent display modules 12 rather than the display modules 12 themselves. As can be seen in the example of FIG. 2B, the support array 50 can include at least one connector 56 between a mounting block 52 of a particular display module 12 and the mounting block 52 of one or more of the display module 12 that are adjacent to that particular display module 12.

For example, as is best seen in the inset of FIG. 2B, there can be four separate connectors 56A, 56B, 56C, and 56D that each connect the mounting block 52A of the first display module 12A to a corresponding mounting blocks 52B, 52C, 52D, and 52E of the second, third, fourth, and fifth display modules 12B, 12C, 12D, and 12E, respectively. For example, a first connector 56A can couple the mounting block 52A of the first display module 12A to the mounting block 52B of the second display module 12B located laterally adjacent to the first display module 12A in one direction (e.g., to the left in FIG. 2B). A second connector 56B can couple the mounting block 52A to the mounting block 52C of the third display module 12C located laterally adjacent to the first display module 12A in an opposing direction (e.g., to the right in FIG. 2B). A third connector 56C can couple the mounting block 52A to the mounting block 52D of the fourth display module 12D located above the first display module 12A. And, a fourth connector 56D can couple the mounting block 52A to the mounting block 52E of the fifth display module 12E located below the first display module 12A. Similarly, the support array 50 can include additional connectors 56 between each mounting block 52B, 52C, 52D, and 52E for the display modules 12B, 12C, 12D, and 12E that are adjacent to the first display module 12A and one or more other display modules 12 that are adjacent to that display module 12B, 12C, 12D, and 12E. For example, the support array 50 can include additional connectors 56E and 56F to connect the mounting block 52D of the fourth display module 12D to the mounting blocks of adjacent display modules 12F and 12G, respectively, and can include additional connectors 56G and 56H to connect the mounting block 52E of the fifth display module 12E to the mounting blocks of adjacent display modules 12H and 12J. Similar coupling between other adjacent display modules 12 can be provided with other connectors 56 throughout the support array 50.

In other examples, the support array can include a plurality of mounting blocks for each display module 12, wherein at least one of the mounting blocks is positioned at an edge of the display module 12 such that the mounting block overlaps the edges of two or more display modules 12. In other words, in some examples, the mounting blocks can serve a dual role as both a structure for connection to one of the tension members to support the display modules 12 and a structure that connects two or more adjacent display modules 12.

Figure 2C:
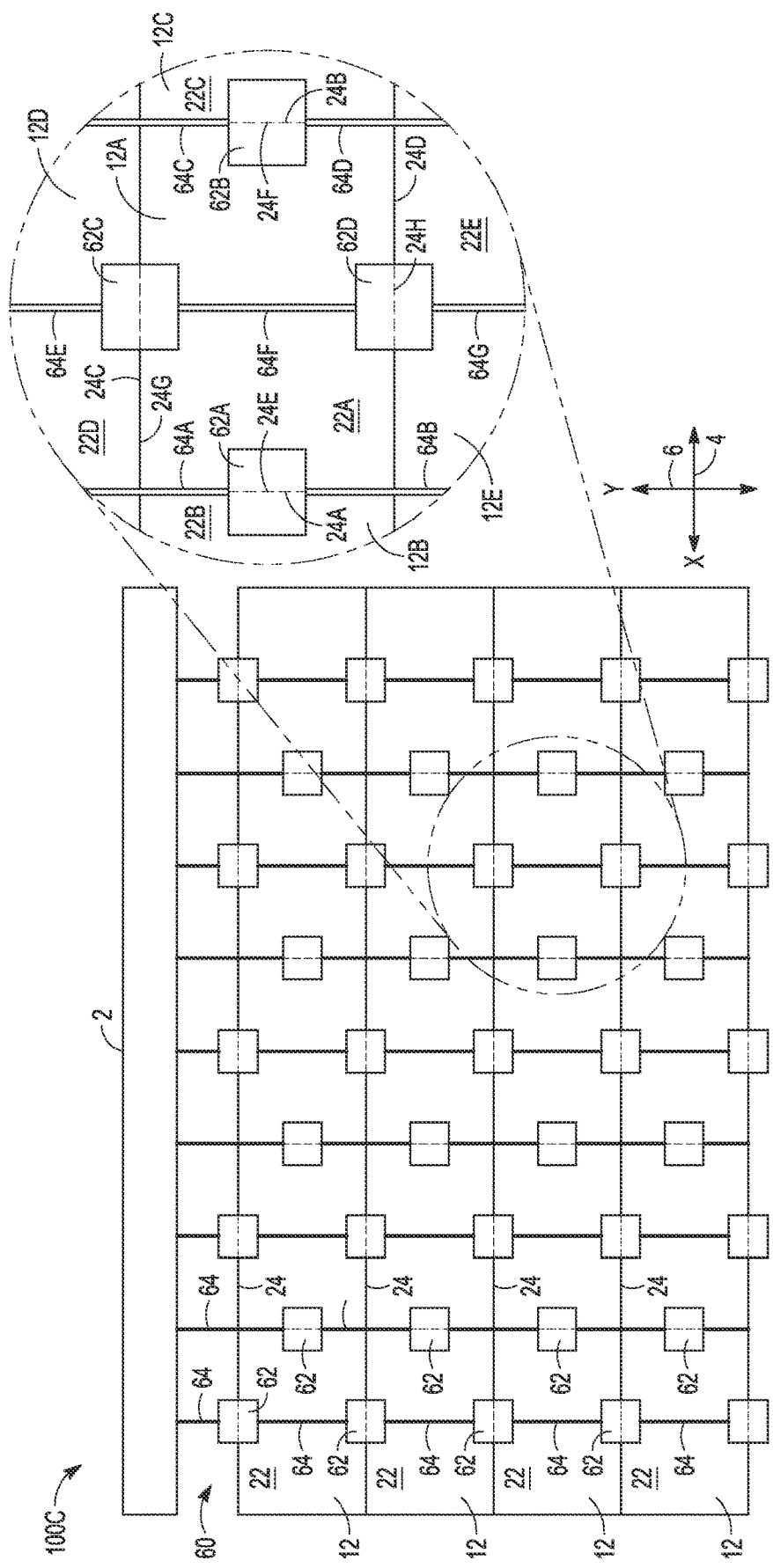

FIG. 2C shows a rear plan view of an example banner display 100C with a support array 60 to support a plurality of display modules 12 that incorporates just such a configuration. Like the support arrays 30, 40, and 50, the support array 60 includes a plurality of mounting blocks 62 connected to one or more tension members 64 which are suspended from a support beam 2. Each display module 12 is coupled to the mounting faces of a corresponding subset of the mounting blocks 62 so that the support array 60 supports the weight of the plurality of display modules 12. In an example, each mounting block 62 of the support array 60 overlaps the edges 24 of a pair of adjacent display modules 12, e.g., at the center of the edges 24, and the mounting face of each mounting block 62 can be coupled to the rear faces 22 of the two adjacent display modules 12 to avoid shifting of the display modules 12 relative to each other.

As discussed above, in the examples of the support arrays 40 and 50 shown in FIGS. 2A and 2B, there is only one mounting block 42, 52 coupled to each display module 12 and, therefore, the support array 40, 50 also includes a plurality of connectors 46, 56 connected to one or both of the mounting blocks 42 or the display modules 12 to prevent or reduce shifting of the display modules 12 relative to one another. In contrast, in an example, each mounting block 62 in the support array 60 in FIG. 2C can overlap and can be coupled to two or more adjacent display modules 12 such that the mounting block 62 itself can act as a connector that can prevent or reduce shifting of the adjacent display modules 12 with respect to one another without the use of any other connector structures, such as the connectors 46 and 56 in the support arrays 40 and 50, respectively.

For example, as can be seen in the inset of FIG. 2C, the first display module 12A is located somewhere in the middle of the banner display 100C, with second and third display modules 12B and 12C adjacent to the lateral edges 24A and 24B of the first display module 12A and fourth and fifth displays 12D and 12E adjacent to the top and bottom edges 24C and 24D of the first display module 12A. In the example banner display 100C, there are four mounting blocks 62 that are coupled to the first display module 12A at the edges 24A, 24B, 24C, 24D, respectively—e.g., a first mounting block 62A coupled to the rear face 22A at the first edge 24A and overlapping the first edge 24A onto a rear face 22B of the second display module 12B; a second mounting block 62B coupled to the rear face 22A at the second edge 24B and overlapping the second edge 24B onto a rear face 22C of the third display module 12C; a third mounting block 62C coupled to the rear face 22A at the third edge 24C and overlapping the third edge 24C onto a rear face 22D of the fourth display module 12D; and a fourth mounting block 62D coupled to the rear face 22A at the fourth edge 24D and overlapping the fourth edge 24D onto a rear face 22E of the fifth display module 12E.

Each mounting block 62 is also coupled to the rear face 22 of the adjacent display module 12 that it overlaps. For example, the first mounting block 62A can be coupled to the rear face 22A of the first display module 12A and to the rear face 22B of the second display module 12B at an edge 24E of the second display module 12B that is adjacent to the first edge 24A of the first display module 12A. Similarly, the second mounting block 62B can be coupled to the rear face 22A and to the rear face 22C of the third display module 12C at an edge 24F of the third display module 12C that is adjacent to the second edge 24B of the first display module 12A. The third mounting block 62C can be coupled to the rear face 22A and to the rear face 22D of the fourth display module 12D at an edge 24G of the fourth display module 12D that is adjacent to the third edge 24C of the first display module 12A. Finally, the fourth mounting block 62D can be coupled to the rear face 22E of the fifth display module 12E at an edge 24H of the fifth display module 12E that is adjacent to the fourth edge 24D of the first display module 12A.

In an example, the first mounting block 62A that is coupled to and supports the first and second display modules 12A and 12B can be coupled to and supported by a first tension member 64A, which in turn can be coupled to and is hanging from a support structure (such as the support beam 2 or from another mounting block in the support array 60 that is located above the first mounting block 62A, not shown in the inset of FIG. 2C). A second tension member 64B can be coupled to and hung from the first mounting block 62A so that the second tension member 64B can be coupled to and support another mounting block located below the first mounting block 62A (not shown in the inset of FIG. 2C). The second mounting block 62B that is coupled to and supports the first and third display modules 12A and 12C can be coupled to and supported by a third tension member 64C, which in turn can be coupled to and supported by a support structure (such as the support beam 2 or another mounting block above the second mounting block 64B, not shown in the inset of FIG. 2C). A fourth tension member 64D can be coupled to and hung from the second mounting block 62B so that the fourth tension member 64B can be coupled to and support another mounting block located below the second mounting block 62B. The third mounting block 62C that is coupled to and supports the first and fourth display modules 12A and 12D can be coupled to and supported by a fifth tension member 64E, which in turn can be coupled to and is hanging from a support structure (such as the support beam 2 or another mounting block above the third mounting block 62C, not shown in the inset of FIG. 2C). A sixth tension member 64F can be coupled to and hung from the third mounting block 62C so that the sixth tension member 64F can be coupled to and support the fourth mounting block 62D (e.g., that is coupled to and support the first and fifth display modules 12A and 12E). In some examples, the sixth tension member 64F may not be necessary because the display module 12A itself can provide support between the third mounting block 62C and the fourth mounting block 62D. A seventh tension member 64G can be coupled to and hung from the fourth mounting block 62D so that the seventh tension member 64G can be coupled to and support another mounting block located below the fourth mounting block 62D.

Figure 2D:
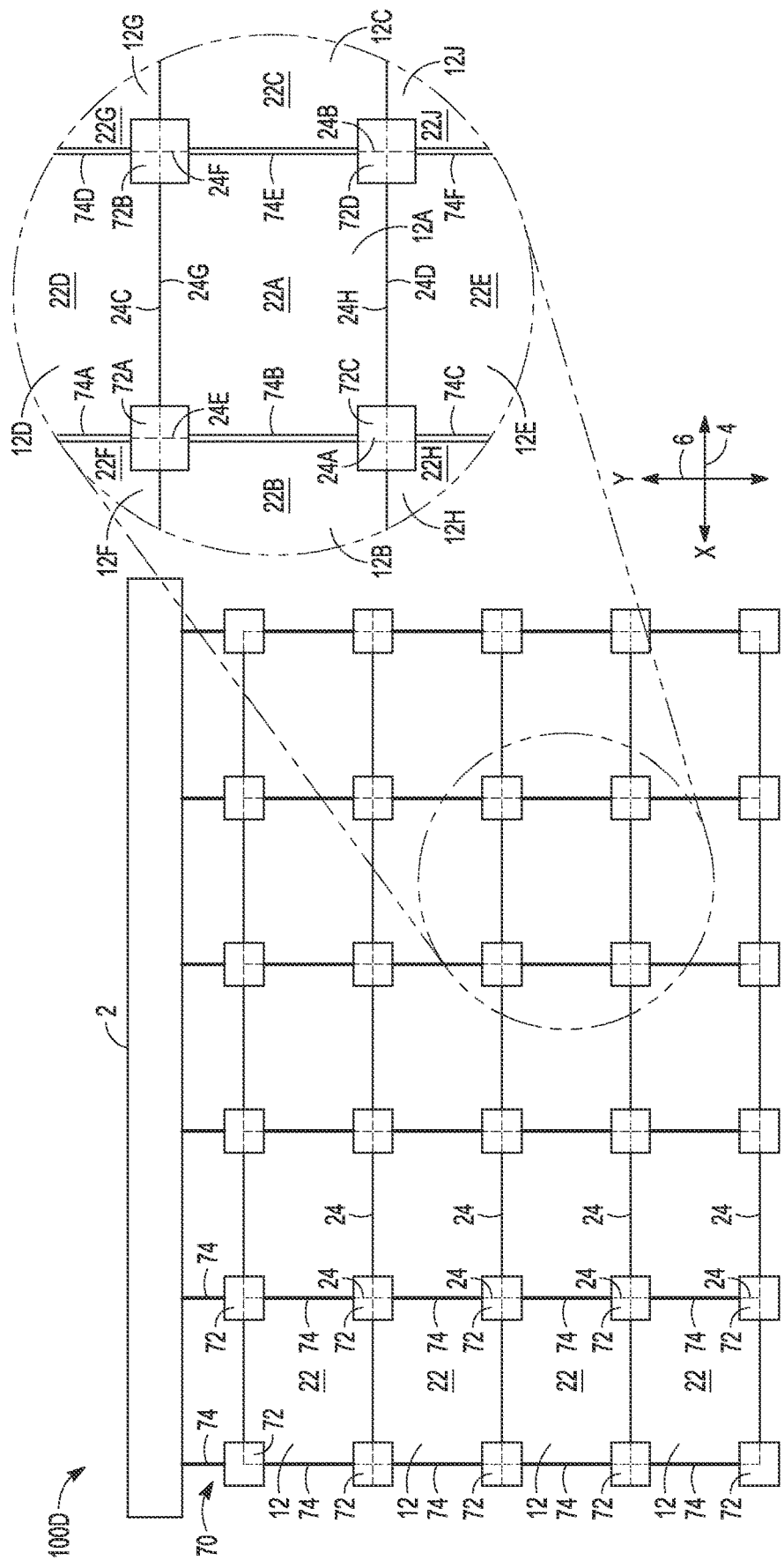

FIG. 2D shows a rear plan view of another example banner display 100D wherein mounting blocks overlap one or more edges of the display modules so that each mounting block can be coupled to and support more than one display module. Like the banner displays 100A, 100B, and 100C, the example banner display 40 of FIG. 2D includes a support array 70 to support a plurality of display modules 12. The support array 70 includes a plurality of mounting blocks 72 connected to one or more tension members 74 which are suspended from a support beam 2. The display modules 12 are coupled to the mounting faces of a subset of the mounting blocks 72 so that the support array 70 supports the weight of the plurality of display modules 12. The primary difference between the support array 70 shown in FIG. 2D and the support array 60 shown in FIG. 2C is that each mounting block 72 is positioned at or proximate to a corresponding corner of each of the display modules 12 to which the mounting block 72 is coupled. Then, the mounting face of the mounting block 72 can be coupled to the rear face 22 of each of the display modules 12 that the mounting block 72 is to support. Each mounting block 72 also can be configured to extend beyond the edges 24 that meet at its corresponding corner so that one or more other display modules 12 can be coupled to the same mounting block 72, e.g., so that the mounting block 72 can be coupled to a total of four different display modules 12 for rectangular-shaped display modules 12 such as those shown in the example of FIG. 2D.

For example, as can be seen in the inset of FIG. 2D, a first display module 12A can be located somewhere in the middle of the banner display 100D, with second and third display modules 12B and 12C adjacent to the lateral edges 24A and 24B of the first display module 12A, fourth and fifth display modules 12D and 12E adjacent to the top and bottom edges 24C and 24D of the first display module 12A, and sixth, seventh, eighth, and ninth display modules 12F, 12G, 12H, and 12J located diagonally athwart from the first display module 12A relative to the corners of the first display module 12A. As can be seen in the inset of FIG. 2D, in an example, the sixth display module 12F is also laterally adjacent to the second display module 12B and the fourth display module 12D, the seventh display module 12G is laterally adjacent to the third display module 12C and the fourth display module 12D, the eighth display module 12H is laterally adjacent to the second display module 12B and the fifth display module 12E, and the ninth display module 12J is laterally adjacent to the third display module 12C and the fifth display module 12E.

In an example, each mounting block 72 of the support array 70 is coupled to four different display modules 12 and there are four different mounting blocks 72 that are coupled to each display module 12. For example, for the first display module 12A, a first mounting block 72A can be coupled to the rear face 22A of the first display module 12A at a first corner (e.g., the top left corner) and can extend past the first lateral edge 24A and the top edge 24C over the rear faces 22B, 22D, and 22F of the second, fourth, and sixth display modules 12B, 12D, and 12F, respectively. A second mounting block 72B can be coupled to the rear face 22A of the first display module 12A at a second corner (e.g., the top right corner) and can extend past the second lateral edge 24B and the top edge 24C over the rear faces 22C, 22D, and 22G of the third, fourth, and seventh display modules 12C, 12D, and 12G, respectively. A third mounting block 72C can be coupled to the rear face 22A of the first display module 12A at a third corner (e.g., the bottom left corner) and can extend past the first lateral edge 24A and the bottom edge 24D of the first display module 12A over the rear faces 22B, 22E, and 22H of the second, fifth, and eighth display modules 12B, 12E, and 12H, respectively. Finally, a fourth mounting block 72D can coupled to the rear face 22A of the first display module 12A at a fourth corner e.g., the bottom right corner) and can extend past the second lateral edge 24B and the bottom edge 24D of the first display module 12A over the rear faces 22C, 22E, and 22J of the third, fifth, and ninth display modules 12C, 12E, and 12J, respectively.

In an example, each mounting block 72 is centered or substantially centered and evenly spaced over the intersection of the corners of each of the display modules 12 to which the mounting block 72 is coupled and is supporting. For example, the first mounting block 72A can be centered and evenly spaced over the top left corner of the first display module 12A, the top right corner of the second display module 12B, the bottom left corner of the fourth display module 12D, and the bottom right corner of the sixth display module 12F. The second mounting block 72B can be centered and evenly spaced over the top right corner of the first display module 12A, the top left corner of the third display module 12C, the bottom right corner of the fourth display module 12D, and the bottom left corner of the seventh display module 12G. The third mounting block 72C can be centered and evenly spaced over the bottom left corner of the first display module 12A, the bottom right corner of the second display module 12B, the top left corner of the fifth display module 12E, and the top right corner of the eighth display module 12H. Finally, the fourth mounting block 72D can be centered and evenly spaced over the bottom right corner of the first display module 12A, the bottom left corner of the third display module 12C, the top right corner of the fifth display module 12E, and the top left corner of the ninth display module 12J.

In an example, the first mounting block 72A that is coupled to and supports the first, second, fourth, and sixth display modules 12A, 12B, 12D, and 12F can be coupled to and supported by a first tension member 74A, which in turn can be coupled to and hung from a support structure (such as the support beam 2 or another mounting block above the first mounting block 72A, not shown in the inset of FIG. 2D). A second tension member 74B can be coupled to and hung from the first mounting block 72A so that the second tension member 74B can be coupled to and support the third mounting block 72C, which is coupled to and supports the first, second, fifth, and eighth display modules 12A, 12B, 12E, and 12H. A third tension member 74C can be coupled to and hung from the third mounting block 72C so that the third tension member 74C can be coupled to and support another mounting block located below the third mounting block 72C (not shown in the inset of FIG. 2D). The second mounting block 72B that is coupled to and supports the first, third, fourth, and seventh display modules 12A, 12C, 12D, and 12G can coupled to and supported by a fourth tension member 74D, which in turn can be coupled to and hung from a support structure (such as the support beam 2 or another mounting block above the second mounting block 72B, not shown in the inset of FIG. 2D). A fifth tension member 74E can be coupled to and hung from the second mounting block 72B so that the fifth tension member 74E can be coupled to and support the fourth mounting block 72D, which is coupled to and supports the first, third, fifth, and ninth display modules 12A, 12C, 12E, and 12J. A sixth tension member 74F can be coupled to and hung from the fourth mounting block 72D so that the sixth tension member 74F can be coupled to and support another mounting block located below the fourth mounting block 72D (not shown in the inset of FIG. 2D).

Mounting Block Example

The mounting blocks 32, 42, 52, 62, 72 in the support arrays 30, 40, 50, 60, and 70 shown in FIGS. 1 and 2A-2D are described generically and are shown as generic rectangular-shaped boxes. Similarly, the supporting tension members 34, 44, 54, 64, and 74 are shown as generic elongated supporting structures. However, those having skill in the art will appreciate that the support blocks and tension members can take many forms and, in some examples, can be specially designed for a particular display module.

A specific example of a support structure system is described with respect to FIGS. 3-11. The support structure system of FIGS. 3-11 includes a plurality of mounting members 200 onto which a plurality of display modules 12 of a display can be mounted. For ease of discussion, the mounting members 200 will be referred to hereinafter as "mounting blocks 200." Each of the mounting blocks 200 can be used as the mounting blocks 32, 42, 52, 62, or 72 in the support arrays 30, 40, 50, 60, and 70 described above with respect to FIGS. 1 and 2A-2D.

Figure 3:
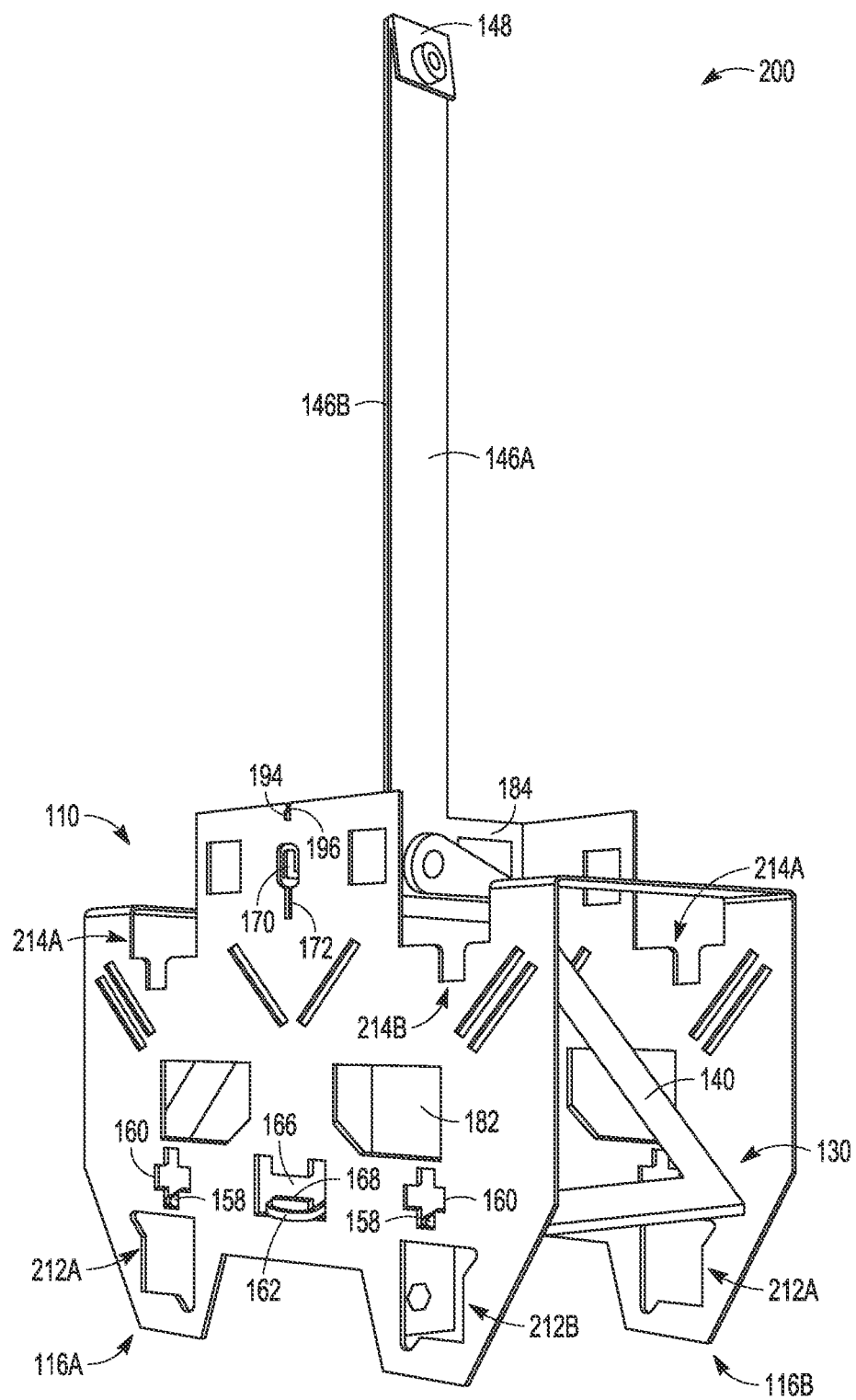
FIG. 3 is a perspective view of an example mounting block that can be used in a support array for supporting display modules of a banner display.

In an example, the mounting blocks 200 are supported by a plurality of structures that have sufficient tensile strength to support the weight of the mounting blocks 200 and the displays 12, also referred to herein as "tension members." In the example of FIGS. 3-11, the mounting blocks 200 and at least a portion of the tension members are made from a combination of three substructures 110, 130, and 180 that are assembled together to form the overall mounting block 200 and at least a portion of its corresponding supporting tension member. FIG. 3 is a perspective view of the example mounting block 200 that is constructed from the three substructures 110, 130, and 180. Further details of the structures of the mounting block 200 and of the three substructures 110, 130, and 180 are described below.

In an example, each substructure 110, 130, 180 can be formed from a sheet material, such as a sheet metal, that can be shaped and, if needed, bent into a specified shape for use in the mounting block 200 or the tension member. In an example, these substructures include: a mounting face substructure 110, which can provide one or more mounting faces onto which display modules can be mounted to form the overall banner display; a truss substructure 130, which can provide additional structural rigidity and integrity to the resulting mounting blocks 200 so that they will be sufficient robust to support the display modules; and a coupling insert 180, which can be inserted through the mounting face substructure 110 and the truss substructure 130 and provides a structure onto which one or both of the mounting face substructure 110 and/or the truss substructure 130 can be engaged or coupled.

The use of relatively thin sheet metal materials to form the substructures 110, 130, and 180 of the mounting block 200 allows the overall support array that can be formed from a plurality of the mounting blocks 200 to be considerably lighter than previously-used conventional mounting structures, such as kill display frames or cabinets. The reduced weight can allow the overall display formed from display modules mounted to the mounting blocks 200 to be substantially lighter than a comparable display made from the same display modules but with a conventional mounting structure, while still having a structural integrity that is comparable to that of the conventional mounting structure. The reduced weight resulting from the use of sheet metal to form the one or more substructures 110, 130, 180 also allows the display to be hung from a wider variety of support substrates, because the support substrate need not have as much mechanical strength because the display is lighter than conventional displays.

As is also described in more detail below, the use of a sheet metal material also provides for the formation and assembly of the mounting blocks 200 at the site where the banner display is being placed, which can allow for reduced costs for shipping, display assembly, and display installation. Therefore, a display made using the support array of the present disclosure provides substantial advantages over those made with conventional mounting structures without much, if any, loss in performance.

Mounting Face Substructure

Figure 4:
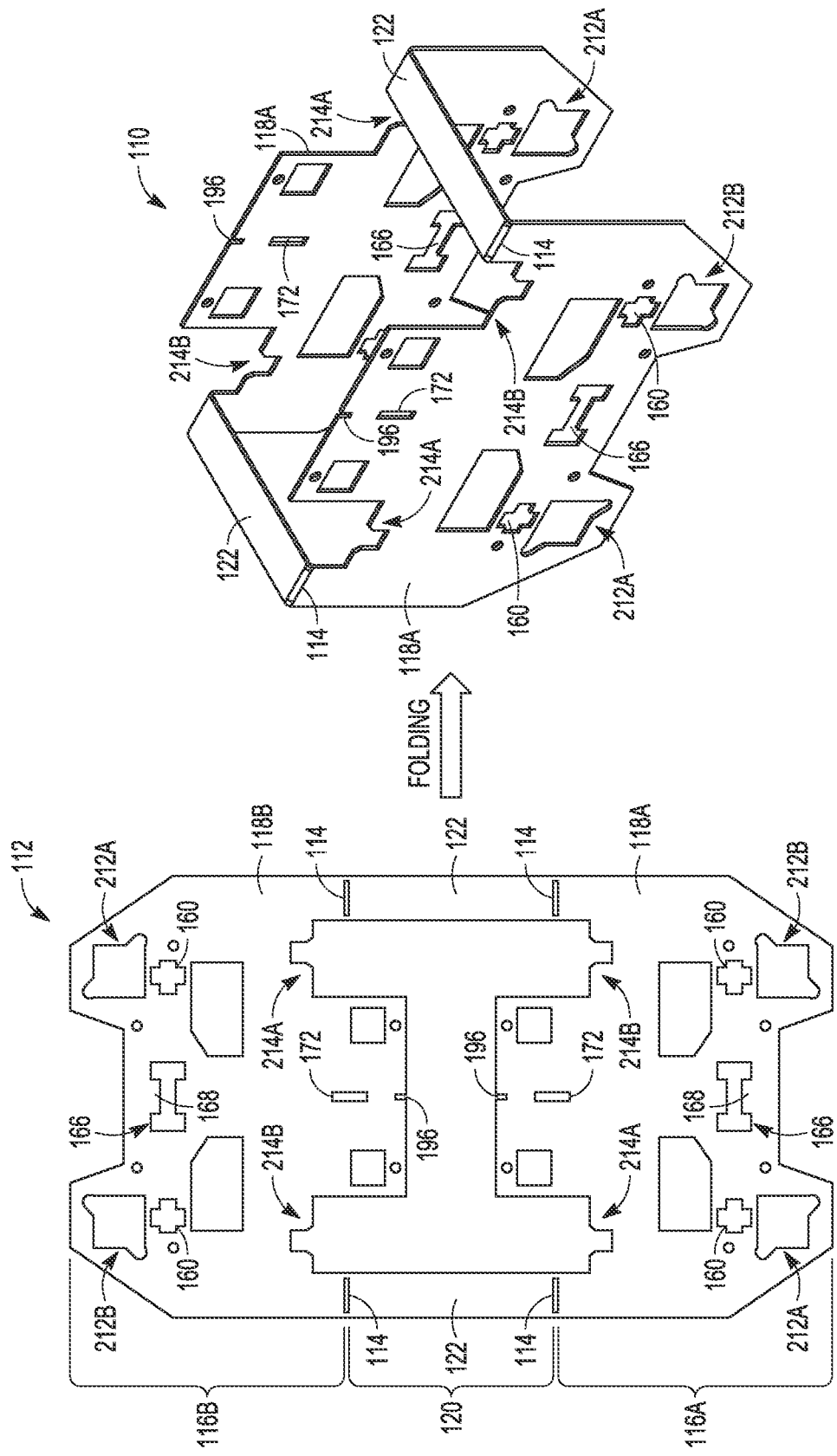
FIG. 4 is a plan view and a perspective view of an example mounting face substructure in an unfolded mode and a folded mode, respectively, used in constructing the mounting block of FIG. 3.

FIG. 4 shows an example mounting face substructure 110 for forming the mounting block 200 of FIG. 3. As its name suggests, the mounting face substructure 110 provides one or more mounting faces onto which the display modules 12 of a banner display can be mounted to form the overall display surface. In an example the mounting face substructure 110 is formed from a sheet metal, such as sheet steel, that has been formed into a flat or substantially flat template 112 (shown on the left side of FIG. 4), referred to hereinafter simply as "the mounting face flat template 112" or "the mounting face template 112." For example, the sheet metal can be formed into the mounting face flat template 112 by punching the sheet steel, e.g., with a punch press or single-hit punch, or cutting the sheet metal, such as with a laser or a high-speed water jet. While sheet metal is the main material described for forming the mounting face template 112 that is used to then form the mounting face substructure 110, the mounting face substructure 110 is not limited to sheet metal. Examples of other materials or methods that can be used to form the mounting blocks 200 other than sheet metal include, but are not limited to, cast metal formed into the shapes of the substructures 110, 130, and 180, or wire material that can be folded or bent into the shapes of the substructures 110, 130, and 180.

Once the sheet metal has been shaped as shown, the mounting face template 112 can be folded into the final shape of the mounting face substructure 110, shown on the right side of FIG. 4. In an example, the folding of the mounting face template 112 can be facilitated by scoring 114 in the mounting face template 112, e.g., in the form of narrow slits 114 within the sheet metal of the mounting face template 112, at the points where the mounting face template 112 is to be folded. The scoring 114 separates the mounting face template 112 into one or more mounting face sections 116 that each provide a mounting face 118 onto which a portion of a rear face 22 of a display module 12 can be mounted. In an example, when there are a plurality of mounting face sections 116, the scoring can separate each mounting face section 116 from at least one middle section 120 that connects the plurality of mounting face sections 116 together. In the example shown in FIG. 4, there are two separate mounting face sections 116A and 116B separated by the middle section 120, wherein each mounting face section 116A, 116B is configured so that the corresponding mounting faces 118A and 118B are on opposing sides of the folded mounting face substructure 110 (as shown on the right side of FIG. 4). In such an example, the middle section 120 includes a pair of crossbars 122 that extend across the mounting face substructure 110 between the two mounting face sections 116A, 116B. As can also be seen in FIG. 4, the mounting face template 112 includes several openings in different positions on each mounting face section 116 to provide different functions, as described in more detail below.

Truss Substructure

Figure 5:
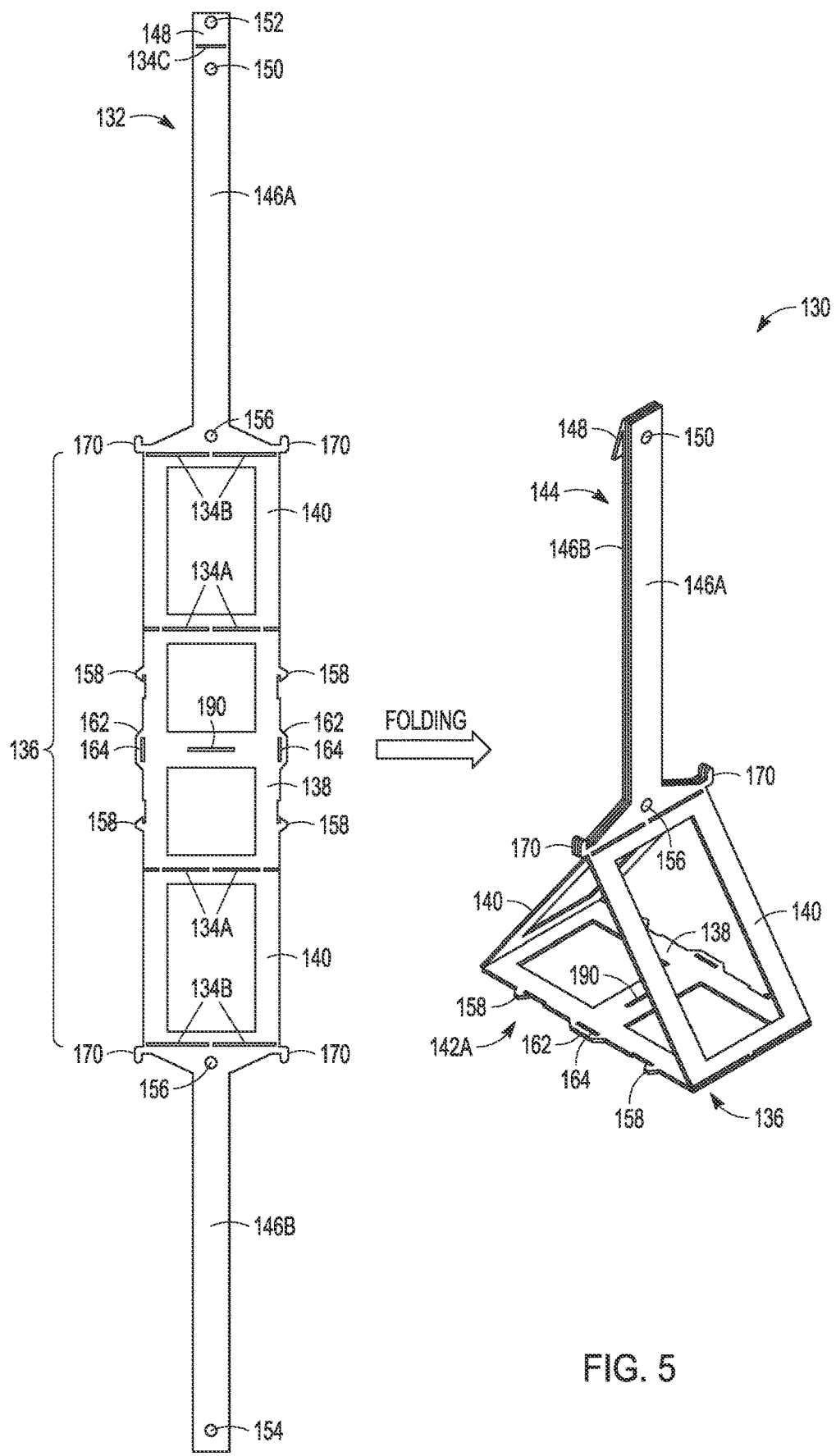
FIG. 5 is a plan view and a perspective view of an example truss substructure in an unfolded mode and a folded mode, respectively, used in constructing the mounting block of FIG. 3.

FIG. 5 shows an example truss substructure 130 which can be part of the example mounting block 200 of FIG. 3. In an example, the truss substructure 130 provides the resulting mounting block 200 with additional structural integrity, particularly in the case where the mounting face substructure 110 is made from a sheet metal, which may tend to bend or ripple during use. In an example, the truss substructure 130 also includes one or more structures that form the tension member for the mounting block 200. In another example, the tension member can be formed as part of one of the other substructures 110, 180, or it can be formed as a separate structure that is coupled to the mounting block 200.

In an example, like the mounting face substructure 110, the truss substructure 130 is formed from sheet metal, such as sheet steel, that has been punched, cut, or otherwise formed into a flat or substantially flat template 132 (shown on the left side of FIG. 5), referred to hereinafter simply as "the truss flat template 132" or "the truss template 132."

While sheet metal is the main material described for forming the template 132, the template 132 is not limited to a sheet metal. The truss template 132 can be folded into the final shape of the truss substructure 130 (shown on the right side of FIG. 5).

Like the mounting face flat template 112 that can form the mounting face substructure 110, the truss template 132 of the trust substructure 130 can include scoring 134, e.g., slits 134 in the sheet metal of the truss template 132, at specified locations that can facilitate folding of the truss template 132 into the truss substructure 130. In the example shown, the scoring 134 allows the truss template 132 to be folded into a truss section 136 and an optional supporting section 144. The truss section 136 provides a structure that can be coupled to the mounting face substructure 110 and can provide additional structural rigidity and integrity for the mounting block 200 formed by the combination of the mounting face substructure 110 and the truss substructure 130.

As will be appreciated by those having skill in the art, triangular cylinder structures are known to be particularly rigid and sturdy, therefore, in an example, the scoring 134 on the truss template 132 provides for a truss section 136 that has a generally triangular cylinder shape, e.g., with a relatively wide base member 138 and a pair of strut members 140 that extend upward from the base member 138 to an apex. In an example, the strut members 140 are coupled to the supporting section 144 at the apex of the truss section 136. In an example, the scoring 134 of the example truss template 132 includes a set of first scoring 134A between the portion of the truss template 132 that will become the base member 138 and each portion that will become one of the strut members 140.

In the example where the mounting face substructure 110 has two opposing mounting face sections 116A and 116B with two opposing mounting faces 118A and 118B, the truss section 136 can provide two separate opposing sides 142A and 142B that correspond to the opposing mounting face sections 116A and 116B of the mounting face substructure 110, wherein a first mounting face section 116A is adjacent to and coupled to a first side 142A of the truss section 136 and a second mounting face section 116B is adjacent to and coupled to a second side 142B of the truss section 136. The truss template 132 can also include one or more structures for coupling the truss substructure 130 to the mounting face substructure 110 or the coupling insert 180, or both, as described in more detail below.

In an example, the truss substructure 130 includes a supporting section 144 that can act as a tension member in the support array that results from a plurality of the mounting blocks 200 such that the supporting section 144 may also be referred to as the tension member section 144. In an example, the supporting section 144 provides a structure that can support the weight of the truss section 136, which in turn can support the weight of the mounting face substructure 110, which in turn can support the weight of one or more display modules 12. In this way, the supporting section 144 acts as a tension member supporting the mounting block 200, similar to the tension members 34 that support the mounting blocks 32 in the example support array 30 of FIG. 1. In an example, the supporting section 144 is formed from one or more supporting members 146 that are formed from one or more portions of the truss template 132, wherein each supporting member 146 is coupled to the truss section 136. In the example shown in FIG. 5, the truss template 132 includes second scoring 134B between each strut member 140 and a corresponding supporting member 146, which allows the supporting members 146 to be bent into position relative to the strut members 140 to form the supporting section 144.

In an example, one or both of the supporting members 146 can include one or more structures for coupling the supporting members 146 together. For example, in the embodiment shown in FIG. 5, a first supporting member 146A is longer than a second supporting member 146B and includes a third scoring 134C that forms a flap 148 at the distal end of the first supporting member 146A that can be folded over the second supporting member 146B in order to hold the second supporting member 146B in place relative to the first supporting member 146A. Each supporting member 146A, 146B can also include a fastener opening, such as the fastener opening 150 through the main portion of the first supporting member 146A, the fastener opening 152 through the flap 148, and the fastener opening 154 through the second supporting member 146B. The positions of the openings 150, 152, and 154 allows them to be aligned or substantially aligned when the flap 148 is folded over the second supporting member 146B such that the same fastener can pass through all three openings 150, 152, and 154 to further secure the first and second supporting members 146A and 146B together. In an example, each supporting member 146A, 146B also includes another fastener opening 156 located closer to the truss section 136 to receive a fastener to further couple the supporting members 146A, 146B together.

In an example, the truss substructure 130 can also include one or more structures to either couple the truss substructure 130 to another one of the substructures 110, 180 or to another mounting block 200 or to maintain a relative position of the truss substructure 130 to another one of the substructures 110, 180. In an example, these structures can include one or more tabs that can be inserted into or through an opening in the structure to which the truss substructure 130 is being coupled or one or more tabs on the structure to which the truss substructure 130 is being coupled that are inserted into or through an opening in the truss substructure 130. For example, one or more tabs 158 can extend outwardly from the base member 138 of the truss substructure 130, wherein each tab 158 can be inserted through a corresponding opening 160 in the mounting face sections 116 of the mounting face substructure 110 (shown in FIGS. 3 and 4).

In an example, an additional tab 162 with a slot 164 therein, also referred to as the slotted tab 162, extends outwardly from the base member 138. The slotted tab 162 is inserted through a corresponding opening 166 in the mounting face section 116, where a tab 168 adjacent to the opening 166 fits into the slot 164 in the slotted tab 162 (as seen in FIG. 3), which is why the opening 166 will also be referred to herein as the "tabbed opening 166". The combination of the one or more tabs 158 inserted into the openings 160 and the slotted tab 162 engaged with the tabbed opening 166 maintain the relative position of the truss section 136 relative to the mounting face sections 116. Another set of one or more tabs 170 can be included that extend outwardly from the supporting members 146A, 146B and are inserted through one or more corresponding slots 172 in the mounting face sections 116A, 116B to maintain the relative position of the supporting section 144 relative to the mounting face sections 116. The combination of one or more of the tabs 158 and openings 160, the slotted tab 162 and the tabbed opening 166, and the tabs 170 and the slots 172 act to securely couple the truss substructure 130 to the mounting face substructure 110.

Coupling Insert

Figure 6:
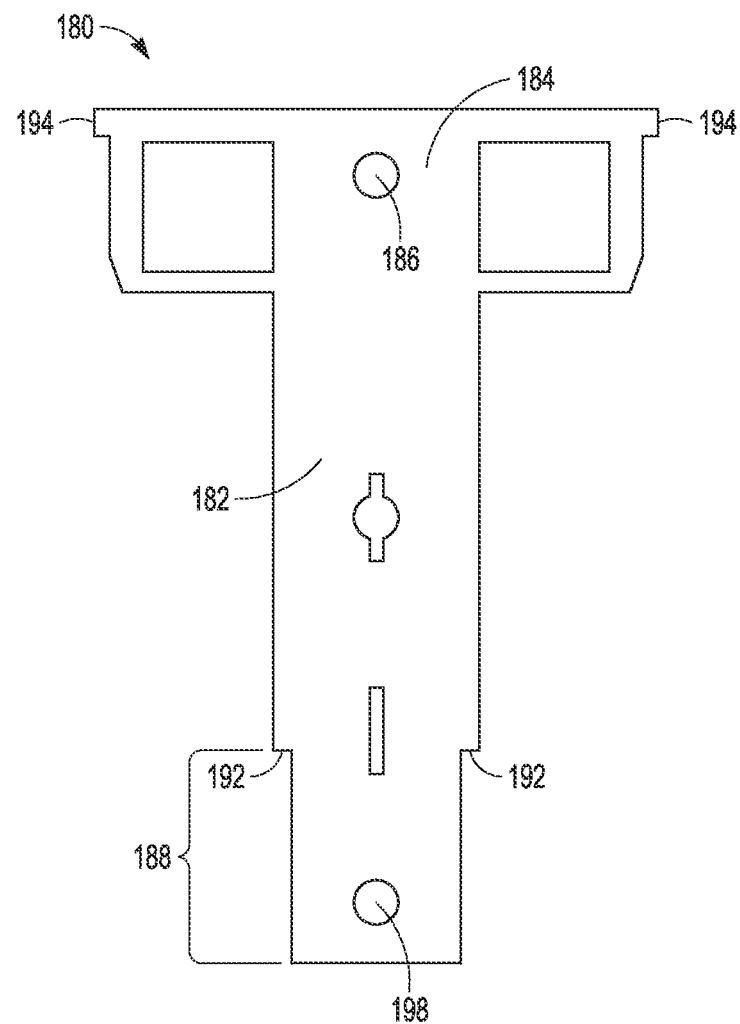
FIG. 6 is an elevation view of an example coupling insert used in constructing the mounting block of FIG. 3.

FIG. 6 shows an example coupling insert 180 that can be positioned relative to the mounting face substructure 110 and the truss substructure 130 to form the mounting block 200 of FIG. 3. In an example, the coupling insert 180 is formed from sheet metal, such as sheet steel, that has been punched, cut, or otherwise formed into the shape of the coupling insert 180. In other words, in an example the coupling insert 180 can be a flat or substantially flat member, which can, for example, be formed from sheet metal.

In an example, the coupling insert 180 includes an elongated central member 182 and a cross member 184 that extends laterally outward from the central member 182. When forming the mounting block 200, the coupling insert 180 is positioned so that the cross member 184 is positioned adjacent to the apex of the truss section 146 of the truss substructure 130. A fastener opening 186 in the cross member 184 can be aligned with the fastener openings 156 in the supporting members 146A, 146B and the same fastener can be inserted through the openings 156 and 186 to couple the coupling insert 180 to the truss substructure 130.

In an example, a bottom portion 188 of the central member 182 can be inserted through a corresponding slot 190 in the base member 138 of the truss substructure 130, which can further maintain the relative position of the coupling insert 180 relative to the truss substructure 130. In an example, the bottom portion 188 has a lateral width that is approximately equal to a length of the slot 190. In an example, shown in FIG. 6, the bottom portion 188 has a width that is narrower than the width of the rest of the central member 182 so that the wider portion of the central member 182 forms one or more shoulders 192 that will engage the base member 138 of the truss substructure 130 so that when a user is assembling the mounting block 200 a specified relative position of the coupling insert 180 relative to the truss substructure 130 can be easily maintained. In an example, the coupling insert 180 can further include one or more tabs 194 that extend laterally outward from the cross member 184. Each tab 194 can be inserted through a corresponding slot 196 in one of the mounting face sections 116A, 116B of the mounting face substructure 110, which can maintain the relative position of the coupling insert 180 relative to the mounting face substructure 110.

Figure 7:
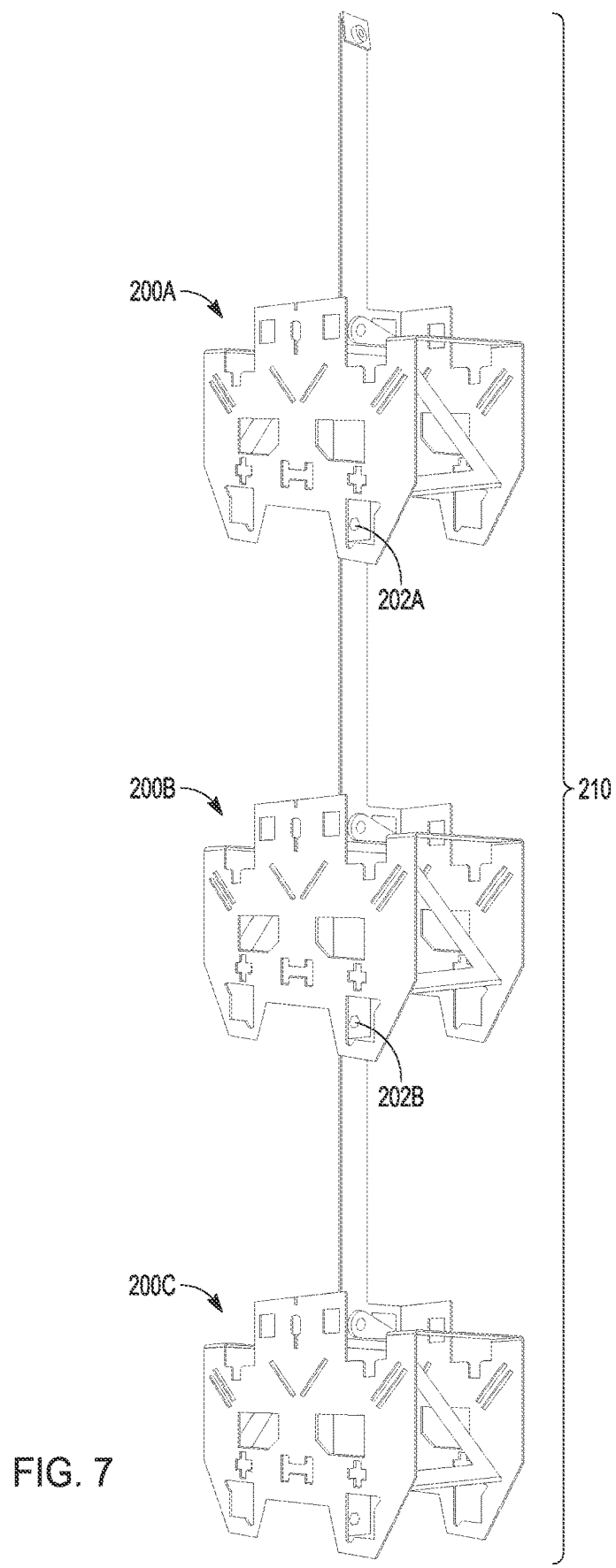
FIG. 7 is a perspective view of an example support spine for supporting display modules of a display, wherein the support spine is formed from a plurality of the mounting blocks of FIG. 3 connected together.

In an example, the bottom portion 188 of the coupling insert 180 includes a fastener opening 198 that can receive a fastener to couple the coupling insert 180 to another structure. In an example, the fastener opening 198 in the coupling insert 180 of a first mounting block 200A can be aligned with the fastener openings 150, 152, and 154 in the supporting section 144 of a second mounting block 200B so that a fastener 202A can be inserted through the openings 150, 152, 154, and 198 in order to couple the first mounting block 200A to the second mounting block 200B, as shown in FIG. 7. Similarly, the fastener opening 198 in the coupling insert 180 of the second mounting block 200B can be aligned with the fastener openings 150, 152, and 154 in the supporting section 144 of a third mounting block 200C so that a fastener 202B can be inserted through the openings 150, 152, 154, and 198 to couple the second mounting block 200B to the third mounting block 200C. In this way, the fastener openings 198 in the coupling inserts 180 can allow a series of vertically aligned mounting blocks 200A, 200B, 200C to form a mounting block chain 210, which will also be referred to herein as a mounting block spine 210, or simply a spine 210.

The use of sheet metal to form the templates 112 and 132 that form the mounting face substructure 110 and the truss substructure 130, respectively, and to form the coupling insert 180 can allow for relatively easy manipulation of the templates 112 and 132 and the coupling insert 180 to form the resulting mounting block 200. For example, the sheet metal and, if needed, the scoring 114 and 134, can allow each template 112, 132 to be relatively easily bent in order to form the mounting face substructure 110 and the truss substructure 130, respectively. In an example, the sheet metal can allow a user to form the substructures 110 and 130 on demand simply by bending the templates 112 and 132 by hand, i.e., without needing to use specialized tools or machinery and/or with much less reliance on brute strength. The mounting blocks 200 formed from sheet metal materials also tend to be relatively light and therefore can be lifted and moved around without relying on brute strength as well. In other examples, the relative ease with which the templates 112 and 132 can be folded into the shape of the substructures 110 and 130 can allow the substructures 110, 130, and 180 and the resulting mounting block 200 to be assembled in an automated assembly process, which can automatically fold the templates 112 and 132 into their corresponding substructures 110 and 130, then combine and assemble the substructures 110, 130, and 180 together to form a mounting block 200, then link a plurality of the mounting blocks 200 together into a corresponding spine 210.

The reduction in strength and/or size needed to handle the mounting blocks 200 of the present disclosure, as well as the substructures that may be designed to form the mounting blocks 200 (e.g., the substructures 110, 130, and 180) and the template or templates that may form them (e.g., the templates 112 and 132 to form the substructures 110 and 130) allows a larger number of people to be eligible to perform the formation of the mounting blocks 200 and the mounting of the display modules 220 onto the support structure system to form a display 230. The increased pool of potential installers equates to a larger potential supply of installers for the resulting display 230, and thus an improved installation cost.

The use of sheet metal to form substructures that form the mounting blocks 200 allows one or more of the precursor templates and/or the substructures can be made to be flat or substantially flat so that they can be more easily and compactly packed for shipping. This, in turn, can substantially reduce the cost of shipping the supporting structure for the display, further reducing the overall cost of the banner display of the present disclosure compared to conventional banner display support structures.

Mounting of Display Modules

Each mounting block 200 also can include one or more structures that provide for mounting of one or more display modules to each mounting face section 116 of the mounting blocks 200 so that the support array comprising a plurality of the mounting blocks 200 (e.g., in the form of mounting block spines 210) can support a plurality of display modules in order to form one or more displays. In an example, each mounting face section 116A, 116B of the mounting face substructure 110 includes one or more features that allow for mounting of one or more display modules onto the mounting face sections 116A, 116B (also referred to as "display module mounting features" or "module mounting features").

In an example, the display module mounting features comprise one or more openings or cutouts in each mounting face section 116. In an example, each opening or cutout has a specified shape into which fits a corresponding feature on the display module. For example, each opening or cutout can have an irregular, atypically shape so that each will only receive the correct corresponding display module mounting feature.

In an example, best seen in FIG. 4, the mounting face sections 116A, 116B include mounting openings or cutouts located proximate to the four corners of the mounting faces 118A, 118B, such as first and second mounting openings 212A, 212B proximate to the bottom left and bottom right corners, respectively (collectively referred to as "mounting openings 212") and first and second mounting cutouts 214A, 214B proximate to the top left and top right corners, respectively, of each mounting face section 116 (collectively referred to as "mounting cutouts 214").

Each display module that is to be mounted onto the mounting blocks 200 can include one or more corresponding features configured to engage with and collectively couple the display module to one or more of the mounting blocks 200 (also referred to herein as "block coupling features"). In an example, each of the one or more block coupling features are configured to engage with a corresponding one of the display module mounting features. For example, a first set of each of the mounting openings 212 and each of the mounting cutouts 214. The engagement of the corresponding block coupling features with the mounting openings 212 and the mounting cutouts 214 can allow the display module to be secured to in a specified position relative to the mounting block 200. Collectively, the mounting openings 212 and mounting cutouts 214 of all the mounting blocks 200 in the support array can secure each display module of a particular display in its specified position relative to all of the other display modules in the display.

In an example, each module mounting opening or cutout has a specified shape that corresponds to a matching or substantially matching shape of a corresponding block coupling feature on the display module. For example, each mounting opening 212A, 212B or mounting cutout 214A, 214B can have a unique shape and/or orientation (e.g., an irregular, atypically shape) so that each will only receive the correct corresponding display module mounting feature.

As noted above with reference to FIGS. 2A-2D, each mounting block of a support array can be configured to be coupled to only one display module 12 (as with the support blocks 42 and 52 in the support arrays 40 and 50 of FIGS. 2A and 2B, respectively), or the mounting blocks can be configured to be coupled to more than one display module 12 (e.g., the support blocks 62 that are each configured to be coupled to two adjacent display modules 12 and the support blocks 72 that are each configured to be coupled to four adjacent display modules 12 in the support arrays 60 and 70 of FIGS. 2C and 2D, respectively). In examples where the mounting blocks 200 are configured for engaging with and coupling more than one display module, the mounting openings 212 and the mounting cutouts 214 can be positioned so that they engage with block coupling features of more than one display module.

In an example, the mounting blocks 200 described with respect to FIGS. 3-6 are configured to each engage with four different display modules. Specifically, each mounting opening 212 and each mounting cutout 214 engage a corresponding block coupling feature from a different display module. In other words, the block coupling feature that engages the first mounting cutout 214A is on a first display module, the block coupling feature that engages the second mounting cutout 214B is on a second display module, the block coupling feature that engages the first mounting opening 212A is on a third display module, and the block coupling feature that engages the second mounting opening 212B is on a fourth display module.

Figure 8:
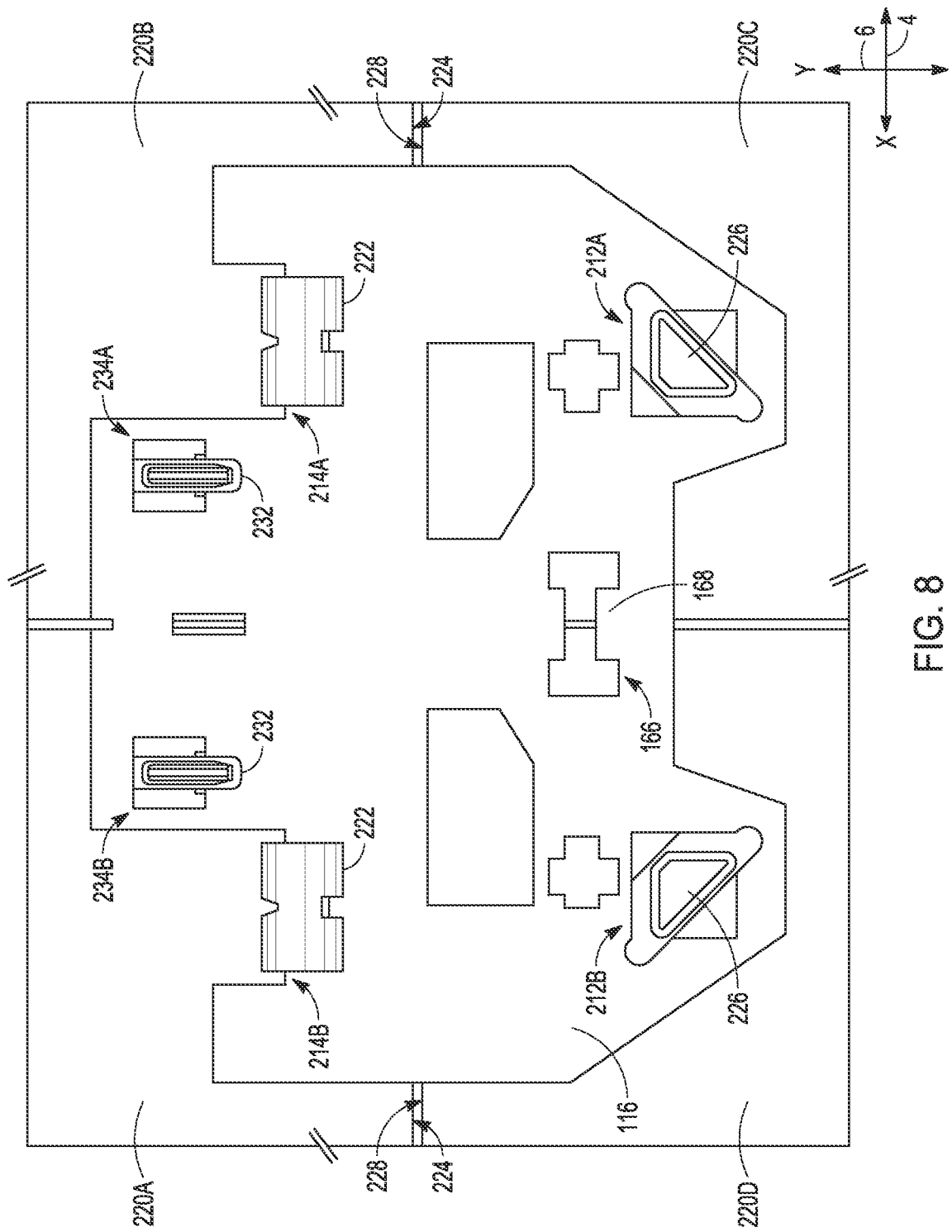
FIG. 8 is rear plan view of four display modules mounted to a mounting face section of the mounting block of FIG. 3.
Figure 9:
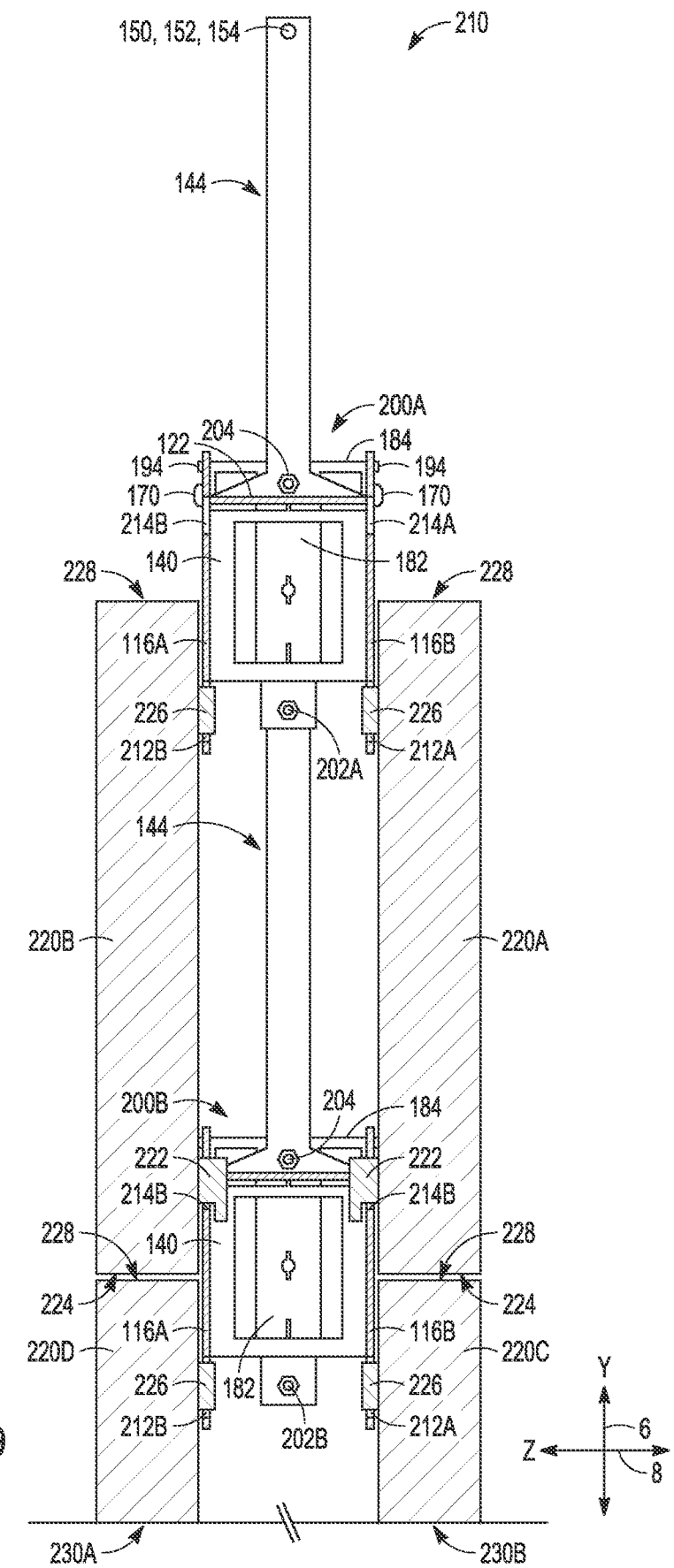
FIG. 9 is a cross-sectional side view of an example support array formed from a plurality of the mounting blocks of FIG. 3 and a plurality of display modules mounted to opposing sides of the support array.

FIG. 8 shows a view of a mounting face section 116 of one of the mounting blocks 200 with four display modules 220A, 220B, 220C, and 220D engaging with the mounting openings 212A, 212B and the mounting cutouts 214A, 214B of the mounting face sections 116. The view in FIG. 8 is from a back side of the mounting face section 116 (e.g., on the side opposing the mounting face 118) so that the corresponding block coupling features that engage the mounting openings 212 and the mounting cutouts 214 can be seen. FIG. 9 shows a cross-sectional view of a pair of assembled mounting blocks 200A, 200B that form at least a portion of a mounting block spine 210 with display modules 220 forming a pair of opposing displays 230A, 230B. Specifically, the display modules 220 that are mounted to the first mounting face sections 116A (i.e., display modules 220B and 220D on the left side of FIG. 9) are part of a first display 230A, and the display modules 220 that are mounted to the second mounting face sections 116B (i.e., display modules 220A and 220C on the right side of FIG. 9) are part of an opposing second display 230B.

In an example, the block coupling features 222 that engage the mounting cutouts 214 are each a generally hook-shaped member that extends rearward from the rear face of the display module 220 past the mounting face section 116 and then extends downward below the mounting cutout 214 and behind the mounting face section 116 (as shown in FIG. 9). These structures will be referred to as "mounting hooks 222" for the sake of brevity. Lateral side edges of the mounting cutouts 214 can prevent the corresponding mounting hook 222 from sliding side-to-side relative to the mounting face section 216, within a specified tolerance. In an example, the mounting hooks 222 on each display module 220 are located proximate to a lower edge 224 of the display module 220, as is the case with the mounting hooks 222 that are proximate to the lower edges 224 of the display modules 220A and 220B as shown in FIGS. 8 and 9.

In an example, the block coupling features 226 that engage the mounting openings 212 are post-like structures 226 (also referred to hereinafter as "mounting posts 226") that extend rearward from the rear face of the display module 220 so that each mounting post 226 can be inserted at least partially through its corresponding mounting opening 212. In an example, each mounting opening 212 has a specified outline shape and its corresponding mounting post 226 has a corresponding profile shape, wherein at least a portion of the profile shape of the mounting post 226 matches or substantially with a corresponding portion of the specified outline shape of the corresponding mounting opening 212. As used herein, the terms "matches," "matching," or similar concepts, when used with respect to the specified outline shape of the mounting opening 212 and the corresponding profile shape of the mounting post 226, means that the portion of the profile shape of the mounting post 226 will fit within the matching portion of the mounting opening 212 within a specified tolerance so that the matching portions of the profile shape of the mounting post 226 and the outline shape of the mounting opening 212 will impede removal of the mounting post 226 from the mounting opening 212 unless the mounting post 226 is pulled out in a specified direction relative to the plane of the mounting face section 116, such as a direction that is normal or substantially normal relative to the plane of the mounting face section 116.

In the example best seen in FIGS. 4 and 8, the outline shape of the mounting openings 212 is generally in the shape of a square with rounded projections extending from two opposing corners, while the profile shape of the mounting posts 226 is generally in the shape of a trapezoid with corresponding rounded portions extending from the longer base. The rounded portions of the profile shape of the mounting posts 226 match or substantially match the rounded projections of the outline shape of the mounting openings 212, and the legs of the trapezoid of the profile shape of the mounting post 226 fit in close proximity to a portion of two of the sides of the square portion of the outline shape of the mounting opening 212. In an example, the mounting posts 226 on each display module 220 are located proximate to an upper edge 228 of the display module 220, as is the case with the mounting posts 226 that are proximate to the upper edges 228 of the display modules 220C and 220D as shown in FIGS. 8 and 9.

In the example shown, each display module 220 is effectively secured to the mounting face section 116 of one or more mounting blocks 200 by a combination of each mounting hook 222 hooked over a corresponding mounting cutout 214 and each mounting post 226 inserted into a corresponding mounting opening 212 so that at least a portion of the profile shape of each mounting post 226 engages the outline shape of the corresponding mounting opening 212. The relatively simple coupling mechanism caused by the interaction of the mounting hooks 222 with the mounting cutouts 214 and the mounting posts 226 with the mounting openings 212 allows the display modules 220 to be relatively easily installed onto the supporting array formed by the spines 210 made up of a plurality of coupled together mounting blocks 200.

One advantage of the specifically positioned display module mounting features on the mounting blocks 200 and the block coupling features on the display modules 220 in combination with the independently and freely hanging mounting block spines 210 can make installation of the display modules 220 onto a support array easier and more manageable for an installer. This is so because the specifically positioned display module mounting features corresponding to specifically positioned block coupling features ensure that all of the display modules 220 in the display 230 are properly aligned and spaced with respect to each other and also ensure that the mounting blocks 200 are properly aligned with respect to the display modules 220. This, in turn, ensures that the display modules 220 will be level throughout the display 230 and also minimizes separation of adjacent display modules 220 and formation of seams between the display modules 220. Even if a seam does form between adjacent display modules 220, the freely hanging spines 210 are able to shift and become realigned with the display modules 220 such that the seam is eliminated. In other words, the display module mounting features and the block coupling features in combination with the independently and freely hanging mounting block spines 210 allow the display 230 to be self-aligning and self-seam correcting, which is a substantial advantage over conventional display support structures. Moreover, the support system of the present disclosure can achieve this self-aligning and self-seam correcting without the installer needing any specialized knowledge or specialized tools. Rather, the installer need only form the mounting block spines 210 and then engage the block coupling features of the particular display module 220 being mounted with its corresponding display module mounting feature on the mounting blocks 220, e.g., by inserting each mounting post 226 of the display module 220 into its corresponding mounting opening 212 and by hooking each mounting hook 222 of the display module 220 over its corresponding mounting cutout 214 in the example shown in FIGS. 8 and 9.

In an example, each display module 200 also includes one or more translating structures 232 that engage with a corresponding structure on the mounting block 200 to effectuate a translation of the display module 220A, 220B. The translation of the display module 220A, 220B can avoid contact or interference with an adjacently positioned display module mounted to the support array during a procedure for mounting the display module 220 to the support array or during a procedure for dismounting the display module 220 from the support array. In an example, best seen in FIG. 8, the one or more translating structures 232 can be located proximate to the bottom edge 224 of the display module 220. However, the translating structures 232 can be located anywhere on the display module 220 where they can provide for effectuating a translation of the display module 220.

The one or more translating structures 232 can each extend from the rear face of the display module 220 and can each engage a corresponding feature of one of the mounting blocks 200, such as a corresponding opening 234A and 234B in the mounting face section 116, corresponding to the translating structures 232 for the first display module 220A and the second display module 220B, respectively. The engagement between each translating structure 232 and the mounting block feature can provide for controlled movement of the display module 220 as it is being mounted or dismounted. Each translating structure 232 can extend rearward and downward from the rear face of the display module 220. In an example, the one or more translating structures 232 cause their respective display module 220 to move between a first position, also referred to herein as a tilted position, relative to the mounting face sections 116 of the mounting blocks 200 to which the display module 220 is mounted, and a second position, also referred to herein as an aligned position relative to the mounting face sections 116.

In an example process of mounting a display module 220 onto the support array, while the display module 220 being mounted is in the tilted position relative to the mounting face section 116, each of the one or more translating structures 232 can be engaged with a corresponding feature of the mounting blocks 200, such as openings 234A, 234B in each mounting face section 116. In an example, an end of each translating structure 232 can be inserted into a corresponding one of the openings 234A, 234B.

After positioning the translating structures 232 while in the tilted position, the display module 220 being mounted can be rotated or pivoted relative to the mounting blocks 200 to move the display module 220 to the aligned position by aligning the display module 220 being mounted relative to the mounting face sections 116, relative to adjacent display modules 220, or both. In an example, the bottom edge 224 of the display module 220 being mounted can be rotated away from the mounting face section 116 while the top edge 228 of the display module 220 being mounted can be rotated toward a corresponding mounting face section 116. The one or more translating structures 232 can be configured so that as the display module 220 being mounted moves from the tilted position to the aligned position, or vice versa, the display module 220 being mounted is translated away from contact or interference with an adjacently-positioned display module 220, such as a display module 220 positioned below the display module 220 being mounted. In an example, the one or more translating structures 232 can cause the bottom edge 224 of the display module 220 being mounted to be translated upward, e.g., lifted, relative to the mounting block 200 as the display module 220 moves from the tilted position to the aligned position so that the bottom edge 224 does not contact the top edge 228 of the display module 220 below the display module 220 being mounted. The one or more translating structures 232 can also cause a top edge of the display module 220 being mounted to be translated downward, e.g., dropped, relative to the mounting block 200 and an adjacent display module as the display module 220 being mounted moves from the tiled position to the aligned position.

Further details regarding the action of translating structures relative to the structure or structures to which display modules are mounted and relative to adjacent display modules is described in U.S. Pat. No. 9,644,823 B2, issued on May 9, 2017, entitled "DISPLAY MODULE MOUNTING," which claims priority to U.S. Provisional Application Ser. No. 61/665,579, filed on Jun. 28, 2012, which are hereby incorporated by reference in their entireties.

Figure 10:
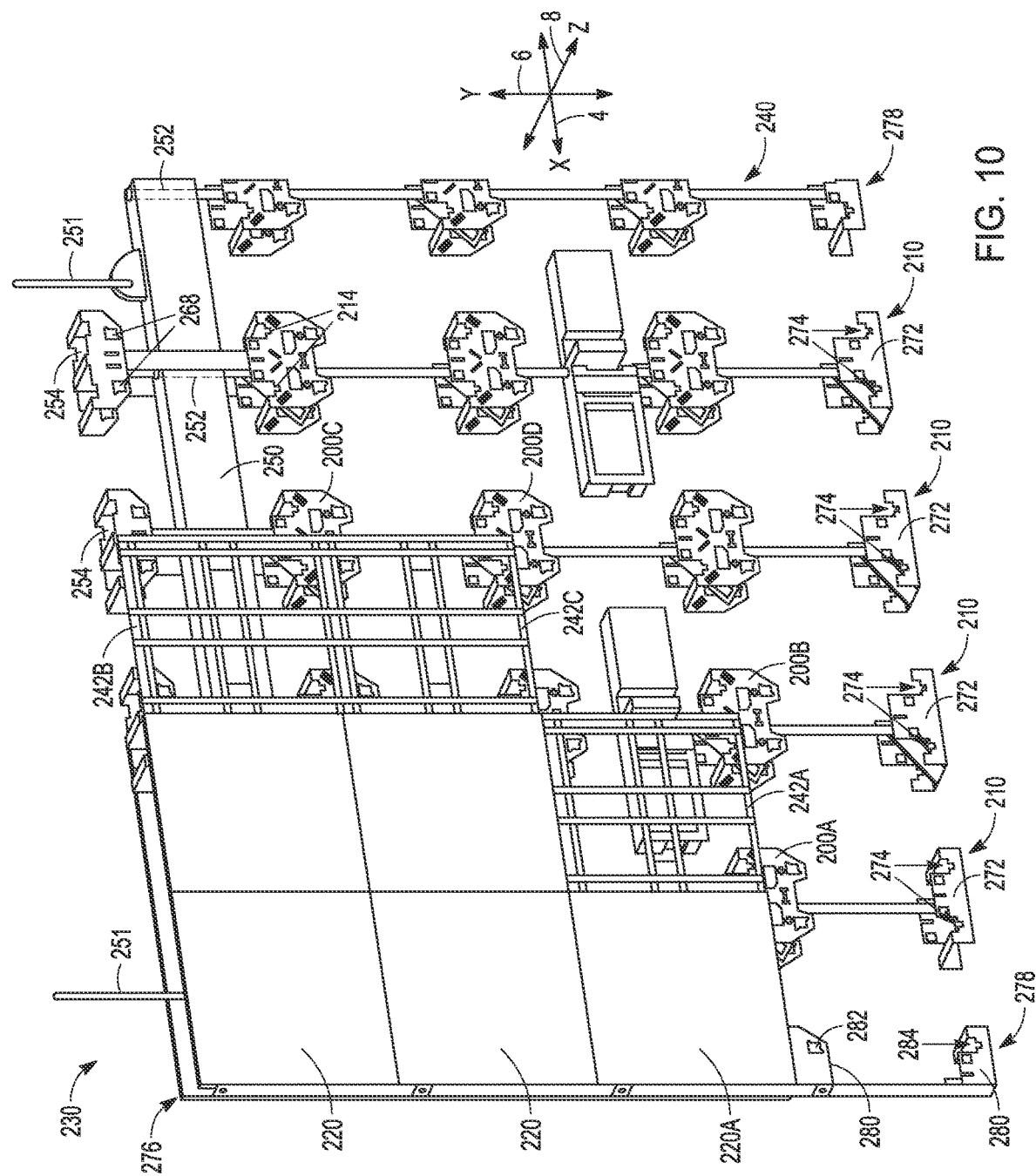
FIG. 10 is perspective view of an example display comprising a plurality of display modules mounted to a support array formed from a plurality of the mounting blocks of FIG. 3, with some of the display modules removed.

The support array that supports the plurality of display modules 220 of a display can include additional structures beyond the specific mounting blocks 200 described above with respect to FIGS. 3-9. For example, FIG. 10 shows a partial view of an example display 230 formed from a plurality of display modules 220 supported by a support array 240 made up of one or more spines 210 of mounting blocks 200. In FIG. 10, some of the display modules 220 are removed and, in the case of some display modules 220, only a display module frame 242 is shown (e.g., with the display surface comprising the plurality of light-emitting elements removed) so that the interaction of the display modules 220 and the support array 240 can be more easily seen.

As can be seen in FIG. 10, the support array 240 is hung from a support beam 250, similar to the support beam 2 shown in FIGS. 1 and 2A-2D. The support beam 250 can be coupled to another support structure, such as a ceiling or wall of a building or to a support frame or other structure. In an example, the support beam 250 is coupled to the other support structure with one or more tension members 251. In the example shown in FIG. 10, each of the one or more tension members 251 comprises a cable 251, such as a steel cable or other cable capable of supporting the weight of the display 230. However, as would be appreciated by those having skill in the art, the support beam 250 can be coupled to the other support structure with other tension members, such as one or more chains or one or more rods, without varying from the scope of the present disclosure. Similarly, those having skill in the art will appreciate that the support beam 250 can be coupled to the other support structure by a means other than one or more tension members, which can be used in place of or in addition to the one or more tension members 251.

In an example, the top-most mounting block 200 of each spine 210 is secured to the support beam 250, such as with a securing bolt 252 that threadingly engages a corresponding threaded bore in the support beam 250. The securing bolt 252 can be connected to the top-most mounting block 200, such as by being coupled to the truss section 136 or to the coupling insert 180 (as shown in FIG. 10). In an example, the support array 240 includes one or more top mounting members 254 that provide additional structure onto which display modules 220 can be mounted.

Figure 11:
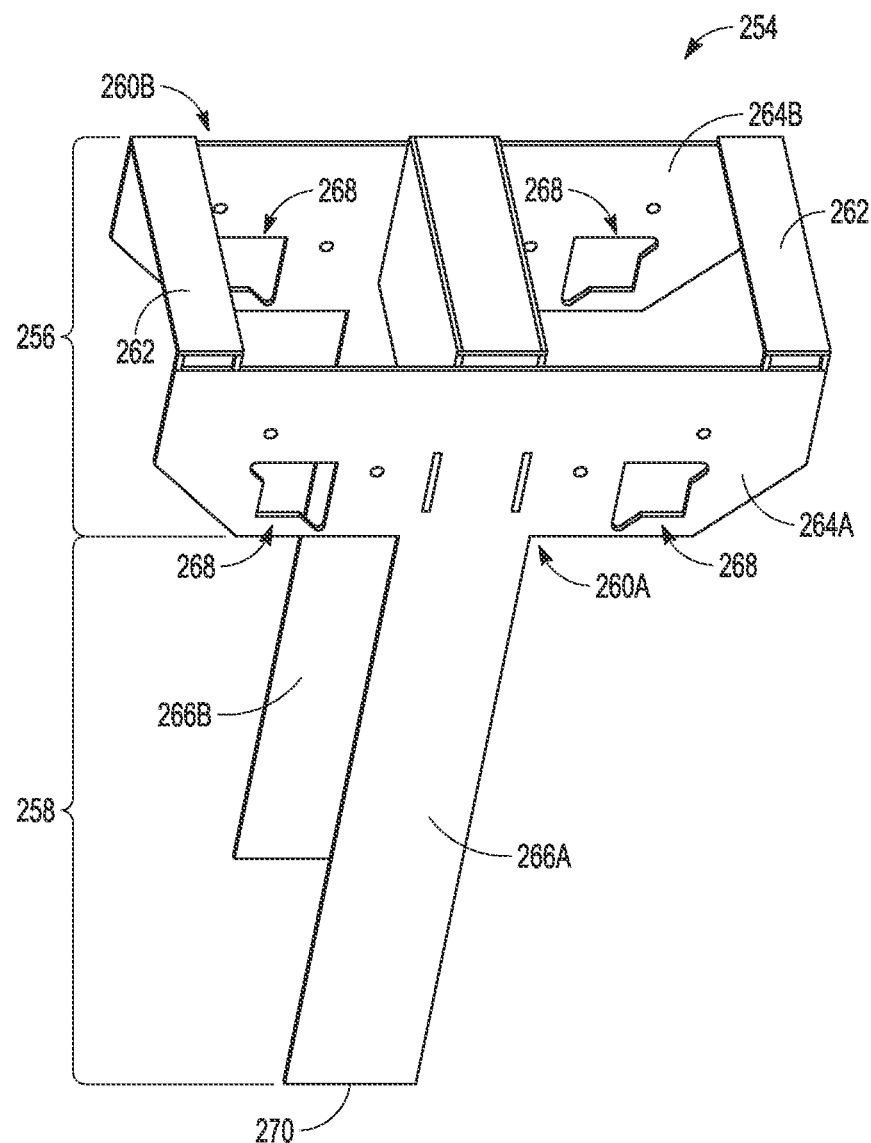
FIG. 11 is a perspective view of an example top mounting member to which a top row of display modules of the display of FIG. 10 are mounted to form a top row of the display of FIG. 10.

FIG. 11 shows a perspective view of the example top mounting member 254. In an example, each top mounting member 254 includes a main mounting section 256, to which one or more display modules 220 can be coupled, and a vertically-extending positioning section 258 that can engage with the top-most mounting block 200 in order to maintain a specified relative position and alignment of the top mounting member 254 relative to the top-most mounting block 200, i.e., so that the top mounting members 254 will be positioned in a specified position so that one or more display module mounting features on each top mounting member 254 will be in a specified position to engage and couple with a corresponding block coupling feature on the display module 220 and so that the one or more display modules 220 mounted to the top mounting member 254 will be aligned with other display modules 220 in the display 230. In an example, the top mounting member 254 can include a pair of opposing planar members 260A, 260B joined by one or more crossbars 262 so that display modules 220 can be mounted to each side of a dual-sided display 230, similar to the opposing mounting face sections 116A, 116B joined by the crossbars 122 of the mounting face substructure 110 shown in FIG. 4. Each of the opposing planar members 260A, 260B include a main mounting portion 264A, 264B and an alignment portion 266A, 266B. As can be seen in FIG. 10, collectively, the mounting portions 264A, 264B make up the main mounting section 256 and the alignment portions 266A, 266B make up the alignment section 258. In an example, the top mounting member 254 can be formed from sheet metal, such as sheet steel, in much the same way that the substructures 110, 130, and 180 can be formed from sheet metal (i.e., formed as sheet metal templates that can be folded and/or assembled into the final form of the structure).

The main mounting section 256 of each top mounting member 254 includes one or more display module mounting features for coupling the top-most display module 220 to the top mounting member 254. In an example, the display module mounting features include one or more mounting openings 268, similar to the mounting openings 212 in the mounting face sections 116 of the main mounting blocks 200 described above with respect to FIGS. 3-9. In an example, the mounting openings 268 in the top mounting member 254 are the same size and shape and have the same position relative to one another as the mounting openings 212 so that the mounting openings 268 can each receive a corresponding one of the mounting posts 226 on a display module 220 in the same way as described above for the mounting openings 212 receiving the mounting posts 226.

As noted above, the positioning section 258 extends downward from the main mounting section 256 of the top mounting member 254. As shown in FIG. 10, the positioning section 258 can extend all the way to the top-most mounting block 200 so that the positioning section 258 contacts one or more structures on the top-most mounting block 200 so that the mounting openings 268 are positioned at a specified position relative to the top-most mounting block 200 so that each mounting opening 268 in the top mounting members 254 will receive a corresponding mounting post 226 of the top-most display modules 220 and the mounting cutouts 214 of the top-most mounting blocks 200 will engage with the mounting hooks 222 of the top-most display modules 220. In an example, a distal end 270 of each positioning portion 266A, 266B rests on and is supported by a corresponding structure on the top-most mounting block 200, such as on the tabs 170 on the truss substructure 130 or the tabs 194 on the coupling insert 180, and the length of the positioning portions 266A, 266B is selected so that the mounting openings 268 are positioned at a specified distance from the mounting cutouts 214 of the top-most mounting block 200.

As can be seen in FIG. 10, in an example, the top mounting members 254 are placed over the top of the support beam 250 so that the mounting openings 268 of the top mounting members 254 are positioned vertically above the support beam 250 while the mounting cutouts 214 of the top-most mounting blocks 200 are vertically below the support beam 250. This causes the top-most row of display modules 220 to be mounted in front of the support beam 250 so that the support beam 250 is obscured to viewers of the display 230, which gives the resulting display 230 a more uniform appearance, e.g., with only the front faces of the display modules 220 being visible to viewers looking at the display 230.

In an example, such as in the display 230 of FIG. 10, a majority of the display modules 220 in the display 230 can be supported by spines 210 made up of the specific mounting blocks 200 described above with respect to FIGS. 3-9. These specific mounting blocks 200 and spines 210 will, therefore, be referred to as the "primary mounting blocks 200" and the "primary spines 210." FIG. 10 shows that each primary spine 210 in the support array 240 includes a plurality of the primary mounting blocks 200 as described above with respect to FIGS. 3-9.

In an example, however, if a primary mounting block 200 were to be used as the bottom-most mounting block in each spine 210, then a bottom portion of the primary mounting block 200 would be visible to viewers of the display 230 below the bottom of the bottom-most display modules 220 (which are not shown in FIG. 10 in order to better see the support array 240, as noted above), similar to how a bottom portion of the primary mounting blocks 200A and 200B are visible below the display module 220A and the frame 242A in the representation of the display 230 depicted in FIG. 10. Therefore, in an example, instead of using the primary mounting blocks 200 at the bottom end of each spine 210, the bottom-most mounting block can be a modified mounting block 272, also referred to herein as the "bottom mounting block 272." The bottom mounting block 272 does not include all of the structures described above for the primary mounting block 200, but rather only includes those structures that are necessary to connect to the mounting block 200 located above the bottom mounting block 272 on that spine 210 and to mount the bottom-most display modules 220 to the modified mounting blocks 272. For example, the bottom mounting block 272 can include a modified version of the truss substructure and its supporting members in order to connect the bottom mounting block 272 to the primary mounting block 200 that is directly above the bottom mounting block 272 but does not need a structure to couple to a mounting block below the bottom mounting block 272. Also, rather than having both the mounting openings 212 and mounting cutouts 214 of the mounting block 200 for mounting display modules 220, the bottom mounting block 272 includes only a set of mounting cutouts 274 to engage with one or more block coupling features of the bottom-most display modules 220 (e.g., with the mounting hooks 222 of the bottom-most display modules 220).

Similarly, in an example, if primary mounting blocks 200 were used at a side edge of the display 230, such as along the left edge 276 of the display 230 as depicted in FIG. 10, than a portion of the primary mounting blocks 200 would be visible laterally to the side of the display edge 276, similar to how the primary mounting blocks 200C and 200D are visible to the right of the frames 242B and 242C in the display 230 as depicted in FIG. 10. Therefore, instead of using a primary spine 210 of primary mounting blocks 200 along the display edge 276, a modified spine 278 is used along the display edge 276 (also referred to herein as the "edge spine 278"), wherein the edge spine 278 includes modified mounting blocks 280, (also referred to herein as the "edge mounting blocks 280"). Similar to the bottom mounting blocks 272, in an example, each edge mounting block 280 does not include all of the structures described above for the primary mounting blocks 200, but rather only includes those structures that are necessary to connect to the display modules 220 along the display edge 276, and also to connect either to an edge mounting block 280 located above the edge mounting block 280 in question or to couple to the support beam 250. For example, each edge mounting block 280 can include a modified version of the truss substructure and its supporting members in order to connect to the edge mounting block 280 that is directly above the edge mounting block 280 in question. Also, rather than having two mounting openings 212 and two mounting cutouts 214, as with the primary mounting block 200, the edge mounting blocks 280 each can include a single mounting opening 282 and a single mounting cutout 284, which each engage with a corresponding mounting post 226 and a corresponding mounting hook 222, respectively, of one of the display modules 220 along the display edge 276.

Other modified mounting blocks for the display 230 can be envisioned by those having skill in the art without varying from the scope of the present description. For example, at a bottom corner of a display, a "bottom corner mounting block" can be envisioned that combines the aspects of the bottom mounting block 272 and the edge mounting block 280, e.g., with only a mounting cutout to engage a mounting hook 222 of the display module 220 at the bottom corner of the display 230.

In an example, the bottom mounting blocks 272 and the edge mounting blocks 280 can be formed from sheet metal, such as sheet steel, in much the same way as described above for the substructures 110, 130, and 180 (i.e., formed as sheet metal templates that can be folded and/or assembled into the final form of the structure). As noted above, the use of sheet metal to form the structures of the support array 240 allow the support array 240 to be substantially lighter than conventional support arrays such as those made from a rectilinear frame. In one example, mounting blocks 200, 254, 272, and 280 that were made from sheet metal were able to be manufactured so that the overall weight of the support array 240 was as much as 75% lighter than conventional support frames without a substantial loss in support strength. In an example, the overall weight of the structures of the support array 240 (i.e., the mounting blocks 200, 254, 272, and 280) is as low as 0.5 pounds per display module 220 being supported, or less, in an embodiment where the display modules 220 themselves each weigh about 2 pounds.

The use of sheet metal to form the mounting block structures 200, 254, 272, and 280 also allows for the use of much less material to form the support array 240 compared to that which is used for conventional display support frames, which in turn can substantially reduce the cost of materials necessary to form the support array 240. In an example, the materials cost for the mounting block structures 200, 254, 272, and 280 of the support array 240 is as much as 85% less than the materials cost for conventional display support frames.

Finally, the use of sheet metal to form the mounting block structures 200, 254, 272, and 280 allows the overall display 230 to be considerably smaller compared to displays that are mounted on conventional display support frames, particularly in the z-direction 8, which can give the display 230 made from the mounting block structures of the present disclosure a substantial market advantage over the conventional displays. In an example, the display 230 that is mounted to the support array 240 of the present disclosure is as much as 70% thinner in the z-direction 8 when compared to a comparable display that is mounted to a conventional display support frame. In addition, it is conceivable that the mounting block structures 200, 254, 272, and 280 could each be made to be even thinner in the z-direction 8, so that the 70% thinner size is likely not a limitation of the support array 240 of the present disclosure.

The modified mounting blocks along the side edges and bottom edge allow the display 230 to be configured so that the display modules 220 along the edges cover the mounting and support structures (e.g., the mounting blocks 200, 272, 280 and their supporting sections 144, and in some examples, the top mounting members 254 and the support beam 250) so that they are obscured from the view of people observing the display 230. This allows the display modules 220 to form a bezel-less, edge-to-edge display 230. In some examples, obscuring the mounting and support structures results in a display 230 that appears to be almost floating in the air, particularly in examples where the display modules 220 also obscure the support beam 250 from which the mounting blocks 200, 272, 280 are suspended and where the support beam 250 is further supported by one or more tension members 251, such as one or more cables 251.

In another example where a display geometry other than a standard rectangular shape is desired, mounting blocks that provide for the desired geometry can be used, e.g., with module mounting features that are angled relative to the vertical axis of the mounting block (i.e., the axis that runs in the same direction as the supporting members 146) so that one or more displays can be angled relative to the vertical axis (i.e., so that the major and minor axes of the display module are not either parallel or perpendicular to the vertical axis).

Yet another possibility is mounting blocks having varying depth profiles to provide for one or more specified contours in the display surface. As used herein, the term "depth profile" refers to the thickness in the z-direct throughout a mounting block, wherein the thickness can be constant for the entirety of the mounting block or the thickness can vary in a specified way (e.g., tapering at a specified change in thickness in a specified direction) For example, the depth profile of the mounting blocks at the edges of the display 230 can be tapered toward the display edge, i.e., so that the mounting blocks are thinner at the exterior side of the mounting blocks at the display edge and thicker at the interior side opposite the display edge while the mounting blocks in the interior of the display have a depth profile with a uniform thickness, for example the same thickness as that of the interior side of the edge mounting blocks. This combination of depth profiles gives the overall display 230 a tapered or beveled appearance at the display edge. In another example, the depth profiles of one or more sets of mounting blocks can be varied so that the display surface of the display 230 can provide for interesting geometries and effects for the display surface, such as concave portions, convex portions, waves, or other unique contours. Each set of the mounting blocks includes one or more mounting blocks with the same corresponding depth profile, i.e., so that the mounting block or blocks of each set has a depth profile the same as the other mounting blocks in the same set, but has a depth profile different from the depth profiles of the mounting blocks for the other set or sets.

In some examples, the support system for the display can include a specified set of modular and standardized types of mounting blocks, with each specified mounting block type or specified combination of mounting block types having a different geometry corresponding to a specified effect for the display module or display modules that are coupled to that mounting block type. As used in this context, the term "modular" refers to each type of mounting block being configured to be positioned at generally any position of the display surface while still being able to be coupled to the display modules that form the display surface. As used in this context, the term "standardized" refers to each mounting block belonging to a particular group of mounting block types (i.e., all the first mounting blocks) having the same specifications, including dimensions, as every other member of that particular group.

In an example, a supplier of the mounting blocks provides a set of modular mounting blocks that include any combination of:

First mounting blocks that result in the display surface tapering inward from a left edge of the display module or modules coupled to the first mounting blocks toward a tight edge of the display module or modules;

Second mounting blocks that result in the display surface tapering inward from the tight edge toward the left edge;

Third mounting blocks that result in the display surface tapering inward from a top edge of the display module or modules toward a bottom edge of the display module or modules;

Fourth mounting blocks that result in the display surface tapering inward from the bottom edge toward the top edge;

Fifth mounting blocks that result in the display surface tapering inward from a top left corner (i.e., where the top edge and the left edge meet) toward a bottom right corner (i.e., where the bottom edge and the right edge meet);

Sixth mounting blocks that result in the display surface tapering inward from a top right corner (i.e., where the top edge and right edge meet) toward a bottom left corner (i.e., where the bottom edge and the left edge meet); and Seventh mounting blocks that result in the display surface having no taper, i.e., with the display surface at that portion of the display being parallel or substantially parallel to the plane formed by the x-axis and the y-axis.

The specified set of modular and standard mounting blocks is obviously not limited to just these specific geometries, and those having ordinary skill in the art will be able to envision modular mounting block types different from those described above. For example, the set of modular mounting blocks can further include at least one of:

One or more eighth mounting blocks that each have an outline shape different from that of the first through seventh mounting blocks (i.e., a non-rectangular outline shape such as a triangle, pentagon, or other uniform or non-uniform rectilinear shapes, or even a non-rectilinear outline shape such as a circle, oval, or one where at least a portion of the outline shape is regularly or irregularly curved;

One or more ninth mounting blocks that each result in a tapering of the display surface that is similar to one of those described with respect to the first through seventh mounting blocks, but with the tapering caused by each ninth mounting block being modified from that of its corresponding first through seventh mounting blocks, such as a geometry with a varying taper (i.e., a curved taper) for at least a portion of the display surface; and One or more tenth mounting blocks that have a geometry similar to one of those described above for the first through the ninth mounting blocks, but with a different overall size (i.e., either larger or smaller than the corresponding first through ninth mounting blocks).

The varying yet modular and standardized geometries, such as the example geometries described above for the first through the tenth mounting blocks, allows a designer or installer of the display to literally build a desired display surface geometry simply by selecting the combination of modular mounting blocks that corresponds to the desired display surface geometry. Moreover, because the mounting blocks are standardized, it provides for variety and a large amount of control for the designer or installer with the ability to customize the geometry of the display surface depending on the desired effect. This control and customization ability can be achieved while still providing economies of scale because the support system supplier (which may or may not be the same as the supplier of the display modules and electronics) can mass produce each specific type of mounting block.

Another variant for the mounting blocks include different geometries of module mounting features (e.g., different shapes of the mounting openings and mounting cutouts) that engage with different block coupling features, e.g., with display modules with different geometries (i.e., different shapes for the display surface upon which the light-emitting, elements are mounted) having differently-shaped block coupling features (e.g., mounting hooks or mounting posts). The designer of the display 230 can then use the different mounting blocks with multiple module mounting features and the different display modules having different geometries and different block coupling features to design a desired overall display geometry with an irregular shape. This can allow the display designer to customize the display to a customer's desired geometry or to fit the display within a specified, non-rectangular space while still maximizing the total area of the display.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A display comprising:
    a display surface formed from a plurality of display modules arranged in proximity, each display module comprising a plurality of light-emitting elements configured to collectively display one or more of video, graphical, or textual information; and
    a support array onto which the plurality of display modules is mounted to form the display surface, the support array comprising;
        a plurality of tension members; and
        a plurality of support members arranged in an array, each of the plurality of support members comprising a mounting face and each being supported by at least one of the plurality of tension members,
        wherein each of the plurality of tension members are suspended either from a support structure or another one of the plurality of support members,
        wherein each of the plurality of display modules is coupled to the mounting face of one or more of the plurality of support members, and
        wherein a first set of one or more of the support members have a first depth profile and a second set of one or more of the support members have a second depth profile that is different from the first depth profile to provide for a specified contour in the display surface.

2. The display according to claim 1, wherein each support member is constructed from a plurality of substructures that are combined to form the support member.

3. The display according to claim 2, wherein at least one of the plurality of substructures is formed from sheet metal.

4. The display according to claim 2, wherein each substructure is formed by bending a corresponding flat or substantially flat template into a specified shape for the substructure.

5. The display according to claim 2, wherein the plurality of substructures for each support member comprises one or more of a mounting face substructure to which one or more of the plurality of display modules is mounted.

6. The display according to claim 5, wherein each mounting face substructure includes one or more display module mounting features each configured for coupling to one of the plurality of display modules.

7. A display system comprising:
    a display surface formed from a plurality of display modules arranged in proximity, each display module comprising a plurality of light-emitting elements configured to collectively display one or more of video, graphical, or textual information;
    an elongated support member; and
    a support array onto which the plurality of display modules is mounted to form the display surface, the support array comprising;
        a plurality of mounting members arranged in an array, each of the plurality of mounting members each comprising a mounting face portion with one or more first display module mounting features and a tension supporting portion extending upward from the mounting face portion;
        wherein a first row of the plurality of mounting members are suspended from the elongated support member by their tension supporting portions;
        wherein a chain of the plurality of mounting members are suspended from each of the mounting members of the first row, wherein the tension supporting portion of each mounting member of the chain is coupled to the mounting face portion of another one of the plurality of mounting members; and
        a plurality of top mounting members each corresponding to one of the mounting members of the first row, each top mounting member comprising a main mounting portion with one or more second display module mounting features and at least one alignment portion extending downward from the main mounting portion, wherein the at least one alignment portion engages the corresponding mounting member of the first row; and
        wherein each of the plurality of display modules comprises one or more mounting member coupling structures configured for coupling to a corresponding one of the first display module mounting features or a corresponding one of the second display module mounting features,
        wherein each corresponding display module of the plurality of display modules is coupled to the mounting face portions of a subgroup of two or more of the plurality of mounting members, wherein the mounting members of each subgroup are spaced around a periphery of the corresponding display module.

8. The display system according to claim 7, wherein each of the top mounting members are positioned over the elongated support member so that at least a portion of the elongated support member is obscured by a portion of the plurality of display modules when the plurality of display modules is mounted to the support array.

9. The display system according to claim 7, wherein a first set of one or more of the mounting members have a first depth profile and a second set of one or more of the mounting members have a second depth profile that is different from the first depth profile to provide for a specified contour in the display surface.

10. The display system according to claim 7, wherein each mounting member is constructed from a plurality of substructures that are combined to form the mounting member.

11. The display system according to claim 10, wherein at least one of the plurality of substructures is formed from sheet metal.

12. The display system according to claim 10, wherein each substructure can be formed by bending a corresponding flat or substantially template into a specified shape for the substructure.

13. The display system according to claim 7, wherein each top mounting member can be formed by bending a corresponding flat or substantially flat template into a specified shape for the top mounting member.

* * * * *